United States Patent [19]

Andermo

[11] Patent Number: 5,023,559
[45] Date of Patent: * Jun. 11, 1991

[54] CAPACITANCE-TYPE MEASURING DEVICE FOR ABSOLUTE MEASUREMENT OF POSITIONS

[75] Inventor: Nils I. Andermo, Kirkland, Wash.

[73] Assignee: Mitutoyo Corporation, Tokyo, Japan

[*] Notice: The portion of the term of this patent subsequent to Nov. 7, 2006 has been disclaimed.

[21] Appl. No.: 372,773

[22] Filed: Jun. 29, 1989

Related U.S. Application Data

[63] Continuation-in-part of Ser. No. 200,368, May 31, 1988, which is a continuation-in-part of Ser. No. 30,346, Mar. 26, 1987, abandoned, Ser. No. 31,049, Mar. 26, 1987, abandoned, and Ser. No. 35,859, Apr. 8, 1987, abandoned.

[30] Foreign Application Priority Data

| Apr. 4, 1986 | [JP] | Japan | 61-078947 |
| Apr. 4, 1986 | [JP] | Japan | 61-078948 |
| Apr. 9, 1986 | [JP] | Japan | 61-083205 |
| Apr. 11, 1986 | [JP] | Japan | 61-083470 |
| Apr. 15, 1986 | [JP] | Japan | 61-087839 |

[51] Int. Cl.$^5$ .................. G01R 27/26; G08C 19/10
[52] U.S. Cl. .................. 324/662; 324/690; 324/725; 340/870.37
[58] Field of Search ............ 324/61 R, 61 P, 660–662, 324/690, 725; 340/870.37

[56] References Cited

U.S. PATENT DOCUMENTS

| 4,420,754 | 12/1983 | Andermo | 324/61 R |
| 4,429,307 | 1/1984 | Fortescue | 324/61 R |
| 4,743,838 | 5/1988 | Eckerle | 324/61 P |
| 4,879,508 | 11/1989 | Andermo | 324/61 R |

Primary Examiner—Reinhard J. Eisenzopf
Assistant Examiner—Jack B. Harvey
Attorney, Agent, or Firm—Oliff & Berridge

[57] ABSTRACT

Capacitive-type measuring apparatus for making absolute measurements comprises first and second support members which are relatively displaceable with respect to a measurement axis; an array of first electrodes disposed on the first support member; an array of second electrodes disposed on the second support member such that differing portions of the second electrode array are capacitively coupled with the first electrode array in dependence on the relative positions of the support members; an array of third electrodes disposed on the second support member so as to be electrically connected to corresponding second electrodes and spatially offset therefrom by an amount which varies according to the position of the third electrodes from a reference position; and a fourth electrode arrangement disposed on the first support member for providing in combination with the other arrays a plurality of discrete signal transmission paths each having a capacitive transfer function with two components, one of which varies according to a predetermined function over a first wavelength, and the other of which varies according to a predetermined function over a second wavelength shorter than the first. The fourth electrode arrangement permits selective spatial filtering of the two components, thereby permitting different resolution measurements to be made with the same electrode arrays, which measurements can be combined to obtain high accuracy absolute position measurements over an extended measuring range.

30 Claims, 22 Drawing Sheets

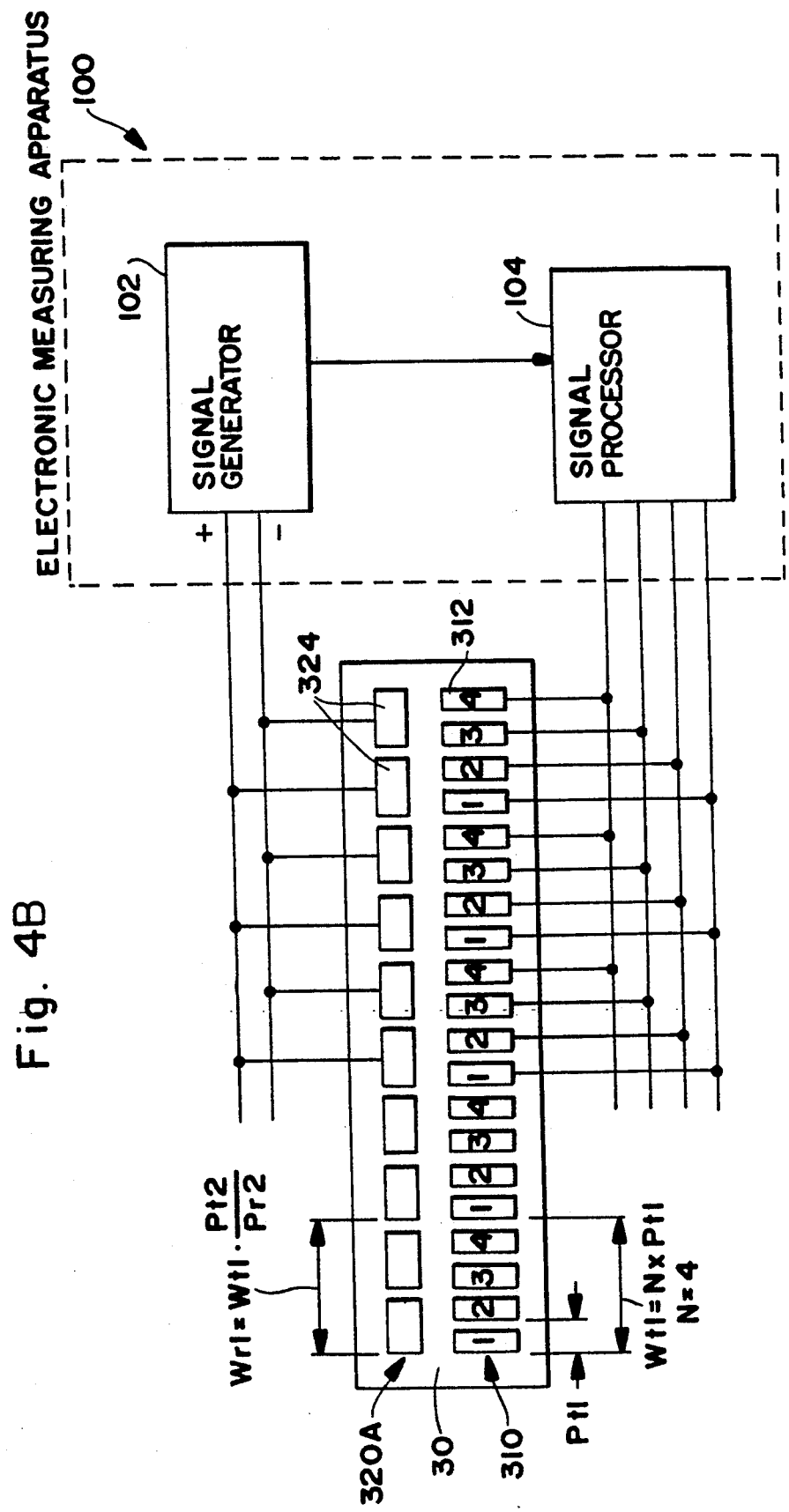

Fig. 6

| | | CONTROL SIGNAL 112 | | | | 127-1 | 127-2 | 127-3 | 127-4 | 127-5 | 127-6 | 127-7 | 127-8 |
|---|---|---|---|---|---|---|---|---|---|---|---|---|---|
| | K | U | V | W | F/MC | | | | | | | | |
| COARSE/MEDIUM | 1 | 0 | 0 | 0 | 0 | 0 | 0 | 0 | 0 | 1 | 1 | 1 | 1 |
| | 2 | 0 | 0 | 1 | 0 | 1 | 0 | 0 | 0 | 0 | 1 | 1 | 1 |
| | 3 | 0 | 1 | 0 | 0 | 1 | 1 | 0 | 0 | 0 | 0 | 1 | 1 |
| | 4 | 0 | 1 | 1 | 0 | 1 | 1 | 1 | 0 | 0 | 0 | 0 | 1 |
| | 5 | 1 | 0 | 0 | 0 | 1 | 1 | 1 | 1 | 0 | 0 | 0 | 0 |
| | 6 | 1 | 0 | 1 | 0 | 0 | 1 | 1 | 1 | 1 | 0 | 0 | 0 |
| | 7 | 1 | 1 | 0 | 0 | 0 | 0 | 1 | 1 | 1 | 1 | 0 | 0 |
| | 8 | 1 | 1 | 1 | 0 | 0 | 0 | 0 | 1 | 1 | 1 | 1 | 0 |
| FINE | 1 | 0 | 0 | 0 | 1 | 0 | 1 | 0 | 1 | 1 | 0 | 1 | 0 |
| | 2 | 0 | 0 | 1 | 1 | 1 | 1 | 0 | 1 | 0 | 0 | 1 | 0 |
| | 3 | 0 | 1 | 0 | 1 | 1 | 0 | 0 | 1 | 0 | 1 | 1 | 0 |
| | 4 | 0 | 1 | 1 | 1 | 1 | 0 | 1 | 1 | 0 | 1 | 0 | 0 |
| | 5 | 1 | 0 | 0 | 1 | 1 | 0 | 1 | 0 | 0 | 1 | 0 | 1 |
| | 6 | 1 | 0 | 1 | 1 | 0 | 0 | 1 | 0 | 1 | 1 | 0 | 1 |
| | 7 | 1 | 1 | 0 | 1 | 0 | 1 | 0 | 1 | 0 | 0 | 0 | 1 |
| | 8 | 1 | 1 | 1 | 1 | 0 | 1 | 0 | 0 | 1 | 0 | 1 | 1 |

(GROUP PHASE COMBINATIONS)

SWITCH CONTROL SIGNALS 133

| ROM CONTROL SIGNAL 113 | S11 | S12 | S13 | S14 | S21 | S22 | S23 | S24 | S25 | S26 |
|---|---|---|---|---|---|---|---|---|---|---|
| (FINE) 11 | 1 | 1 | 1 | 1 | 0 | 0 | 1 | 1 | 0 | 0 |
| (MEDIUM) 01 | 0 | 0 | 1 | 1 | 1 | 1 | 1 | 0 | 1 | 0 |
| (COARSE) 10 | 1 | 1 | 0 | 0 | 0 | 1 | 0 | 1 | 1 | 1 |

Fig. 7

MASTER MEASUREMENT PROGRAM

COARSE MODE SUBPROGRAM

MEDIUM MODE SUBPROGRAM

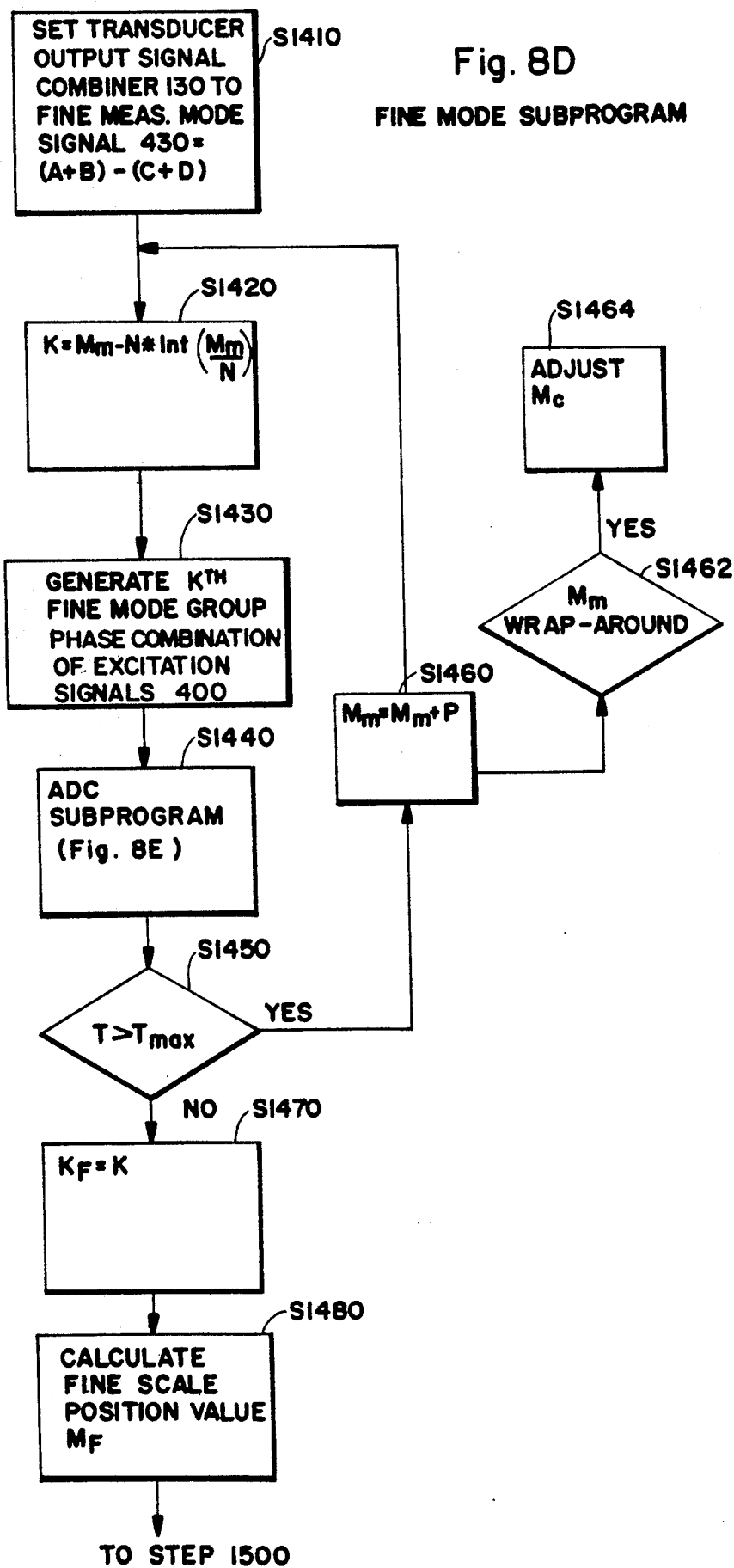

ADC SUBPROGRAM

GROUP PHASE EXCITATION SIGNAL COMBINATIONS

Fig. 12

ROM 2' SWITCH CONTROL SIGNALS 133'

| | CONTROL SIGNAL 113' | | | | S1 | S2 | S3 | S4 | S5 | S6 | S7 | S8 |
|---|---|---|---|---|---|---|---|---|---|---|---|---|
| K | U | V | W | F/MC | | | | | | | | |
| 1 | 0 | 0 | 0 | 0 | 0 | 0 | 0 | 0 | 1 | 1 | 1 | 1 |
| 2 | 0 | 0 | 1 | 0 | 1 | 0 | 0 | 0 | 0 | 1 | 1 | 1 |
| 3 | 0 | 1 | 0 | 0 | 1 | 1 | 0 | 0 | 0 | 0 | 1 | 1 |
| 4 | 0 | 1 | 1 | 0 | 1 | 1 | 1 | 0 | 0 | 0 | 0 | 1 |
| 5 | 1 | 0 | 0 | 0 | 1 | 1 | 1 | 1 | 0 | 0 | 0 | 0 |
| 6 | 1 | 0 | 1 | 0 | 0 | 1 | 1 | 1 | 1 | 0 | 0 | 0 |
| 7 | 1 | 1 | 0 | 0 | 0 | 0 | 1 | 1 | 1 | 1 | 0 | 0 |
| 8 | 1 | 1 | 1 | 0 | 0 | 0 | 0 | 1 | 1 | 1 | 1 | 0 |
| 1 | 0 | 0 | 0 | 1 | 0 | 1 | 0 | 1 | 1 | 0 | 1 | 0 |
| 2 | 0 | 0 | 1 | 1 | 1 | 1 | 0 | 1 | 0 | 0 | 1 | 0 |
| 3 | 0 | 1 | 0 | 1 | 1 | 0 | 0 | 1 | 0 | 1 | 1 | 0 |
| 4 | 0 | 1 | 1 | 1 | 1 | 0 | 1 | 1 | 0 | 1 | 0 | 0 |
| 5 | 1 | 0 | 0 | 1 | 1 | 0 | 1 | 0 | 0 | 1 | 0 | 1 |
| 6 | 1 | 0 | 1 | 1 | 0 | 0 | 1 | 0 | 1 | 1 | 0 | 1 |
| 7 | 1 | 1 | 0 | 1 | 0 | 1 | 1 | 0 | 1 | 0 | 0 | 1 |
| 8 | 1 | 1 | 1 | 1 | 0 | 1 | 0 | 0 | 1 | 0 | 1 | 1 |

GROUP PHASE COMBINATIONS — COARSE/MEDIUM (rows 1–8 top), FINE (rows 1–8 bottom)

| ROM1' CONTROL SIGNAL 112' | ROM1' OUTPUTS | | | | | |
|---|---|---|---|---|---|---|
| | 127-1' | 127-2' | 127-3' | 127-4' | 127-5' | 127-6' |
| (FINE) 11 | 1 | 1 | 0 | 0 | 1 | 1 |
| (MEDIUM) 01 | 0 | 1 | 0 | 0 | 0 | 1 |
| (COARSE) 10 | 1 | 0 | 0 | 1 | 0 | 0 |

Fig. 11

MASTER MEASUREMENT PROGRAM

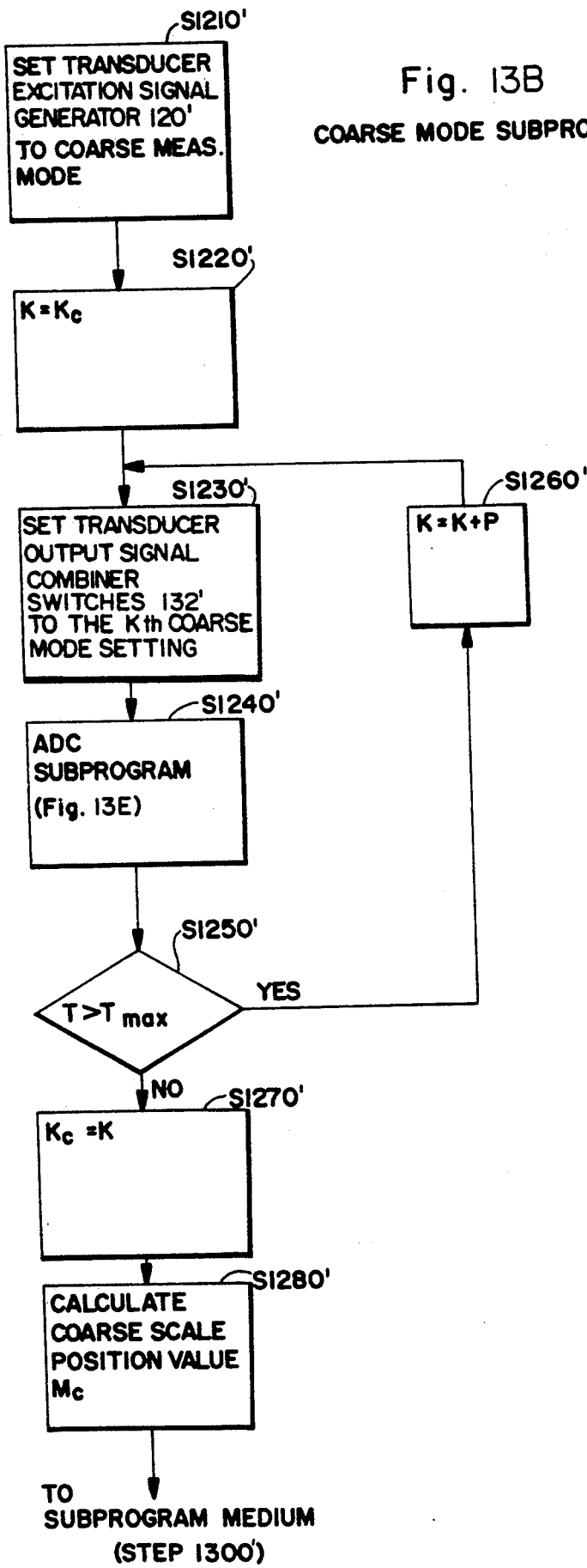

MEDIUM MODE SUBPROGRAM

FINE MODE SUBPROGRAM

ADC SUBPROGRAM

CAPACITANCE-TYPE MEASURING DEVICE FOR ABSOLUTE MEASUREMENT OF POSITIONS

CROSS-REFERENCE TO RELATED APPLICATIONS

The present application is a continuation-in-part application of copending application Ser. No. 07/200,368, filed May 31, 1988; which in turn is a continuation-in-part application of now abandoned applications Ser. Nos. 07/030,346 and 07/031,049, both filed Mar. 26, 1987, and Ser. No. 07/035,859, filed Apr. 8, 1987.

FIELD OF THE INVENTION

The present invention relates generally to capacitance-type measuring devices for making linear and angular measurements, and more particularly to a capacitance-type measuring transducer with an improved electrode arrangement for making absolute measurements of position.

BACKGROUND OF THE INVENTION

Numerous capacitance-type measuring devices for making linear and angular measurements have been developed wherein two support members or scales, on which are respectively mounted arrays of discrete, capacitively coupled electrodes, are displaced relative to each other, and the relative positions of the two scales are determined by sensing the resulting change in the capacitance pattern created by the arrays of electrodes. Typically, the capacitance pattern is sensed by applying a plurality of periodic signals to one of the electrode arrays and measuring the shift in the signals resulting from the transfer to the other array of electrodes. Such measuring devices have a broad range of applications, from large-scale measuring devices such as three-dimensional coordinate measuring systems and numerically controlled finishing machines, to small-scale devices such as portable calipers, micrometers and the like.

Although capacitance-type measuring devices have become increasingly popular, they have heretofore been subject to a number of disadvantages which have limited their wider application. A major source of disadvantages has been the fact that conventional capacitive-type measuring devices have typically only been capable of making relative, and not absolute, measurements. That is, measurements are typically made by sensing the relative change in position of the scales with respect to a reference position, which requires a continuous sensing of the change in the capacitance pattern created by the electrode arrays so that repetitions of the pattern can be counted. Further, relative measurements require that a new reference or zero position be established before every measurement, which makes such devices relatively inconvenient to use.

In addition, the rate at which the scales of relative measurement devices can be displaced with respect to each other is limited by the speed of the signal processing which can be accomplished. On the one hand, if the scales are displaced too quickly, miscounting can occur. On the other hand, increasing the allowable scale displacement speed entails the use of high frequency signals and sophisticated signal processing circuitry, which substantially increases the cost of the measurement devices.

The ability to make absolute measurements of scale position, i.e., measurements based solely on the respective final measurement positions of the scales, obviates the various problems discussed above. A zero or reference setting for the scales can be established during assembly of the measuring device, and there is no need to adjust the setting during subsequent measurements. Nor are there any limitations on the displacement speed of the scales, since the capacitance pattern between the scale electrodes needs to be sensed only at the final measurement position of the scales. Further, the power source needs to be connected only when the final measurement position is to be measured, which greatly reduces the power consumption and allows even small-capacity power sources, such as solar batteries, to be employed.

The present inventor has previously developed a capacitive-type measuring device capable of making absolute measurements, which is shown in FIGS. 10 and 11 of U.S. Pat. No. 4,420,754 ("the '754 Patent"). This device utilizes separate first and second pairs of transmitter/receiver electrode arrays arranged in side-by-side relationship. The relationship of the pitch of the transmitter electrodes to the pitch of the receiver electrodes is the same in each array pair, but the respective transmitter/receiver electrode pitches in the two array pairs differ slightly. Two separate n-phase signals are applied to the respective transmitter electrodes of the two array pairs and two independent signals $V_1$ and $V_2$ are obtained (via associated transfer and detector electrodes) from the respective receiver electrodes in each array pair. An absolute measurement value is derived by measuring the phase difference between the two signals $V_1$ and $V_2$.

However, the utility of the '754 Patent measuring device is limited. For example, because the absolute measurement value calculation is based on two independent measurements, slight errors in either measurement accumulate and can result in large position measurement errors. Consequently, the respective signal processing circuits must have precisely matched performance characteristics in order for accurate absolute position measurements to be obtained. Further, if the two measurements are not made at precisely the same time, even very slight displacement of one support member relative to the other between the times the two measurements are taken can cause very large errors in the position measurement.

In addition, the physical requirement of two separate pairs of electrode arrays in the measuring device of the '754 Patent limits its application in hand measuring tools, which must have a compact size. Further limiting its application in portable measuring devices is the increased power consumption caused by the requirement for duplicate signal processing circuitry.

SUMMARY OF THE INVENTION

These and other disadvantages of the prior art are overcome by a capacitive-type measuring device constructed in accordance with the present invention, which comprises first and second support members, which are relatively displaceable with respect to each other, and at least one of which is displaceable relative to a measurement axis. An array of first electrodes is disposed on the first support member in alignment with the measurement axis; an array of second electrodes is disposed on the second support member in alignment with the measurement axis and such that different portions of the second electrode array are capacitively coupled with the first electrode array in dependence on the relative positions of the supporting members; an array of third electrodes is disposed on the second support member in relative alignment with the second electrode array, with each of the third electrodes being electrically connected to a corresponding one of the second electrodes so as to be offset from the corresponding second electrode by an amount which is a predetermined function of the position of the third electrode relative to a reference position on the measurement axis. The measuring device advantageously further comprises fourth electrode apparatus disposed on the first support element in relative alignment with the first electrode array for sensing the electrode offset or producing an electric field from which the offset can be detected.

In accordance with a further aspect of the present invention, the spatial range occupied by the third electrodes, over which the degree of electrode offset between the third electrodes and the second electrodes changes by a predetermined amount, defines a first measurement range; and the measuring device further comprises an array of fifth electrodes disposed on the second support member in relative alignment with the second electrodes; and at least one group of second electrodes is respectively electrically connected to a corresponding at least one group of fifth electrodes, each of the fifth electrodes in the at least one fifth electrodes group being electrically connected to a corresponding one of the second electrodes so as to be offset from the corresponding second electrode by an amount which is a predetermined function of the position of the fifth electrode relative to the center of the at least one fifth electrode group, and such that the degree of electrode offset changes over the at least one fifth electrode group by the aforementioned predetermined amount, and the spatial range occupied by the at least one fifth electrode group defines a second measurement range smaller than the first measurement range. Advantageously, the measuring device also includes sixth electrode apparatus disposed on the first support element in relative alignment with the first transmitter electrode array for sensing the electrode offset between the fifth electrodes in the at least one fifth electrode group and corresponding second electrodes, or for producing an electric field from which the offset can be sensed.

In accordance with a still further aspect of the present invention, the second electrodes are spaced from each other relative to the measurement axis by a pitch $p_{fl}$ defining a fine wavelength $W_f$, and at least one group of first electrodes is defined by N adjacent electrodes, where N is an integer greater than 2 in value; the at least one first electrode group defines a wavelength $W_t$ and the first electrodes in each group are positioned within the group so as to respectively occupy predetermined group positions which span a distance greater than one wavelength $W_f$ and such that each group position corresponds to the relative position of a different one of a group of relative fine wavelength segment positions obtained by dividing the wavelength $W_t$ into intervals corresponding to the fine wavelength, and dividing each interval into N equal segments.

In accordance with another aspect of the present invention, the measuring apparatus further comprises an excitation signal generator for applying periodically varying excitation signals to the fourth electrode array; and a signal combiner for selectively combining different sets of output signals, produced by the electrodes in each first electrode group in response to the excitation signals, into first and second composite signals; the output signals being combinable in a first order according to the sequence of physical positions occupied by the first electrodes relative to each other in each first electrode group, and in a second order according to the sequence of relative fine wavelength segment positions in which the respective first electrode group positions are arranged. Advantageously, the signal combiner means further comprises circuitry for differentially combining the first and second composite signals to produce a combined output signal. Further, the signal combiner preferably produces N combinations of first and second composite signals, with the first electrode output signals in the first and second composite signals in each of the combinations corresponding to relative spatial phase positions which successively incrementally change from one combination to the next; and the measuring apparatus further comprises: a demodulator for demodulating the combined output signal to produce a corresponding demodulated signal; circuitry for selecting a first one of the combinations of first and second composite signals to produce a first combined output signal; an integrator for performing a dual ramp integration wherein the first demodulated signal corresponding to the first combined signal is integrated for a predetermined time interval, a second one of the combinations of first and second composite signals is selected to produce a second combined output signal such that the corresponding second demodulated signal causes integration of the integrator output in the reverse direction from the integration of said first demodulated signal, and the second demodulated signal is integrated until the integrator output returns to a reference level; circuitry for measuring the integration time of the second demodulated signal integration and for producing a control output when the integration time exceeds a predetermined limit value; and circuitry responsive to the control output for resetting the integrator, for repetitively selectively applying a different pair of first and second ones of the combinations of first and second composite signals to successively produce new first and second combined output signals, and for causing the integrator to integrate the resultant first and second demodulated signals until there is no control output from the integration time measuring circuitry.

These and other features and advantages of the present invention are described in or apparent from the following detailed description of preferred embodiments.

BRIEF DESCRIPTION OF THE DRAWINGS

The preferred embodiments will be described with reference to the drawings, wherein like elements have been denoted throughout the figures with like reference numerals, and wherein:

FIGS. 4A and 4B are diagrammatic partial views of two further alternate embodiments of an absolute measurement caliper constructed in accordance with the present invention.

FIG. 6 is a table showing the relation of control signals for the transducer excitation signal generator included in the measuring circuit of FIG. 5.

FIG. 7 is a table showing the relation of control signals for the transducer output signal combiner included in the measuring circuit of FIG. 5.

FIGS. 8A–8E are flow charts of programs performed by the microprocessor controller included in the measuring circuit of FIG. 5.

FIG. 11 is a table showing the relation of control signals for the transducer excitation signal generator included in the measuring circuit of FIG. 10.

FIG. 12 is a table showing the relation of control signals for the transducer output signal combiner included in the measuring circuit of FIG. 10.

FIGS. 13A–13E are flow charts of programs performed by the microprocessor controller included in the measuring circuit of FIG. 10.

DETAILED DESCRIPTION OF THE PREFERRED EMBODIMENTS

Figure 1A:
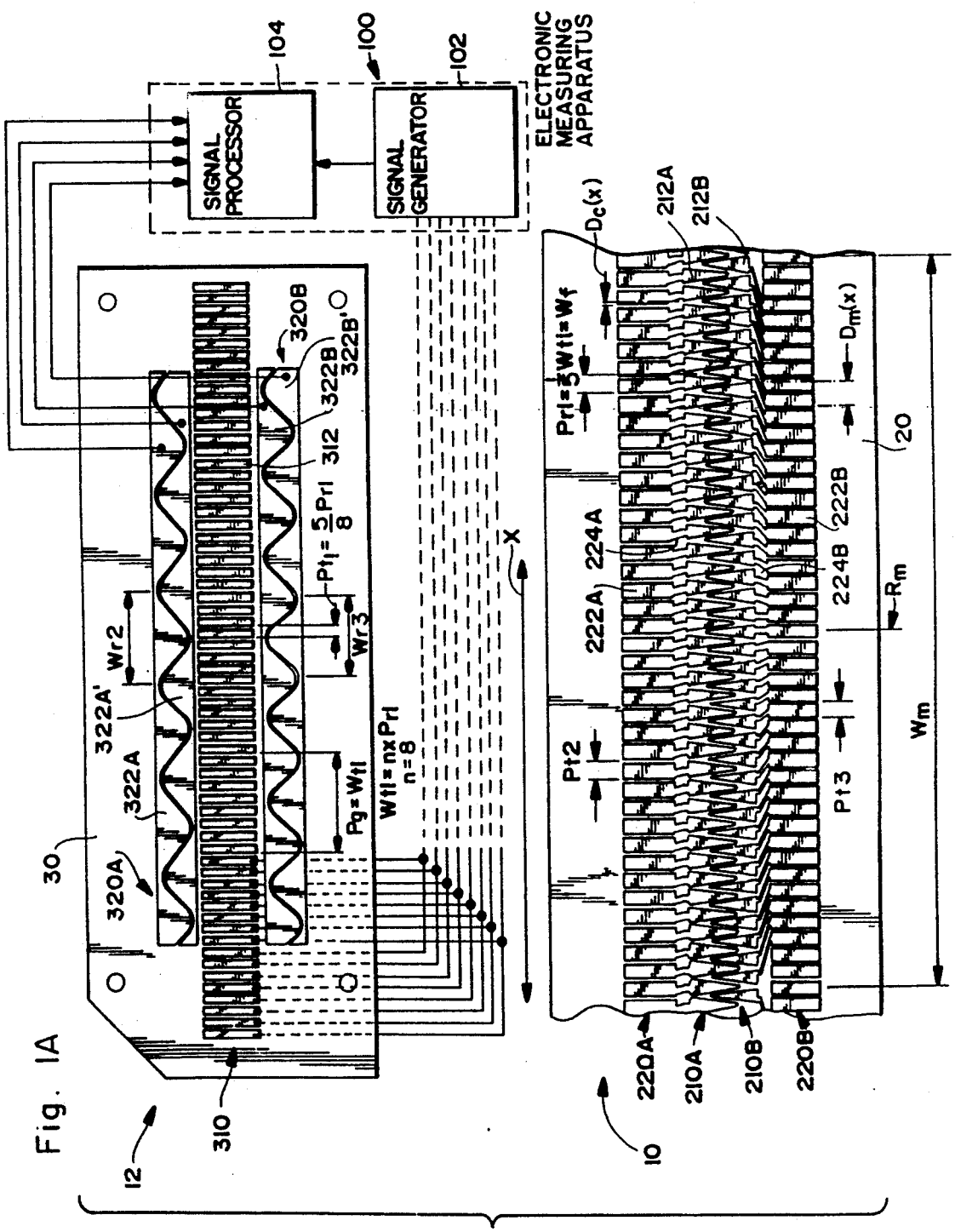
FIGS. 1A and 1B are partly schematic, partly diagrammatic views of two alternate embodiments of an absolute measurement caliper constructed in accordance with the present invention.

The present invention will be described as implemented in portable, hand-held linear measurement calipers. However, it will be appreciated by those of ordinary skill in the art that the present invention is not limited to such measuring devices, and can be implemented in a broad range of large-scale and small-scale measuring devices for making both linear and angular measurements.

Embodiments of a capacitive-type linear absolute measurement caliper 10 constructed in accordance with the present invention are shown in FIGS. 1A–1B, 2A–2B, 3, and 4A–4B which are adapted for making coarse, medium and fine resolution absolute measurements of a measurement position, thereby permitting highly precise absolute measurements to be obtained over a wide measuring range. Caliper 10 basically comprises a capacitive transducer 12 and electronic measuring apparatus 100 for applying electrical excitation signals to transducer 12 and processing the resultant output signals produced by transducer 12 to ascertain a given measurement position. Transducer 12 comprises a linear first scale or support member 20, and a linear second scale or support member 30 slidably mounted on support member 20 for longitudinal axial displacement with respect to member 20 so as to define a measurement axis X. As is conventional, support members 20 and 30 advantageously are provided with extending caliper arms (not shown) which permit dimensional measurements of an object to be made. The gap between support members 20 and 30 advantageously is on the order of 0.05 mm (0.002 inch).

Disposed on the respective support members in respectively opposing relationships to each other, and in relative alignment with the measurement axis and the respective caliper arms, are seven electrode arrays, generally denoted 210A, 210B, 220A, 220B, 310, 320A and 320B. As is described in more detail hereinbelow, in the embodiments of FIGS. 1A and 4A a plurality of periodically varying signals are applied to electrode array 310 in predetermined sequences and the resulting signals produced by different electrical configurations of electrode arrays 320A and 320B are sensed in dependence on the type (coarse, medium or fine) of measurement. Accordingly, for convenience of description with respect to the embodiments of FIGS. 1A and 4A, the electrodes of array 310 will be described as first transmitter electrodes, the electrodes of arrays 210A and 210B will be described as first receiver electrodes, the electrodes of arrays 220A and 220B will be described as second and third transmitter electrodes, respectively, and the electrodes of arrays 320A and 320B will be described as second and third receiver electrodes, respectively, in conformance with the respective functions of the electrode arrays in the transmission of signals from array 310 to arrays 320A and 320B.

Figure 1B:
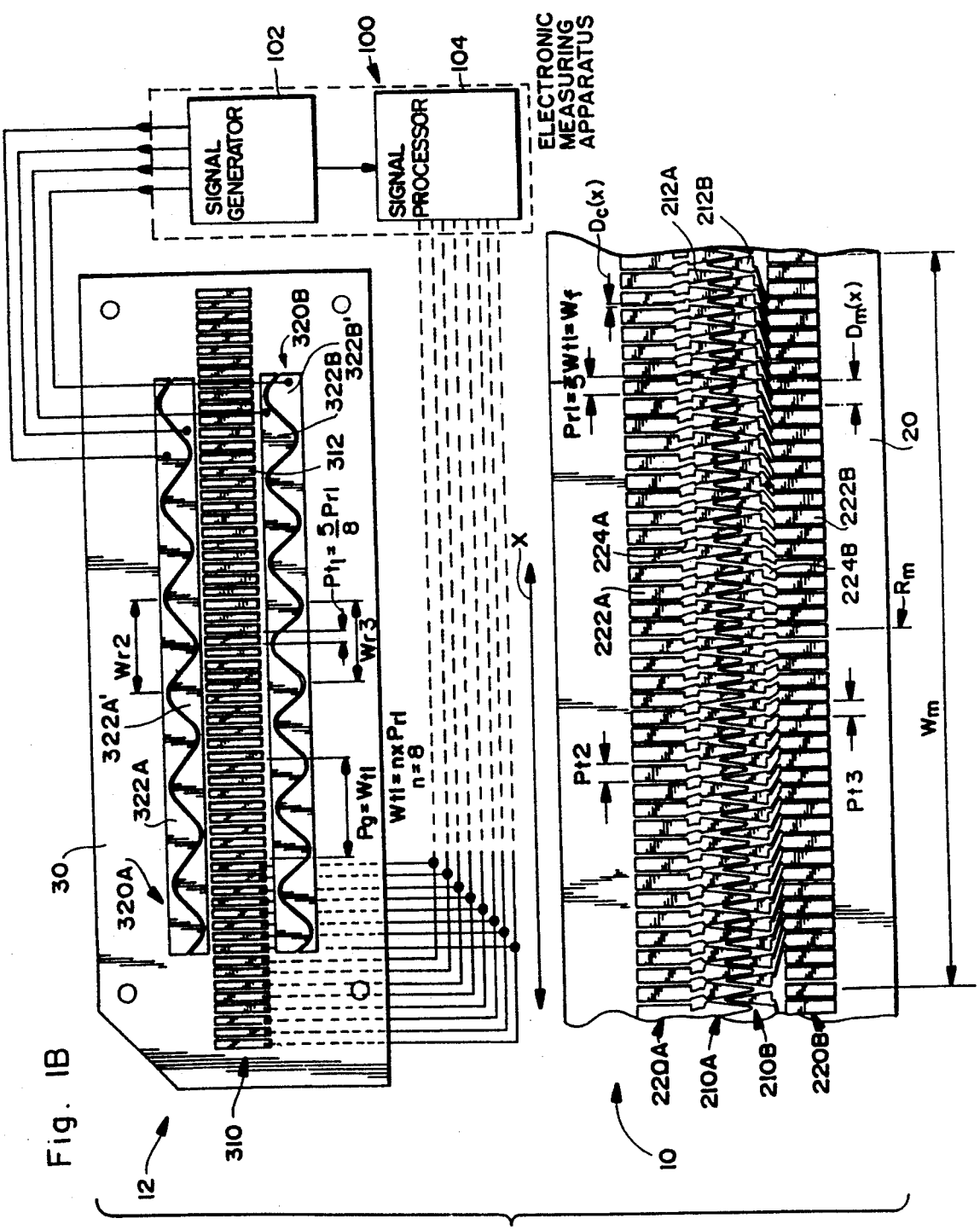
Figure 4A:
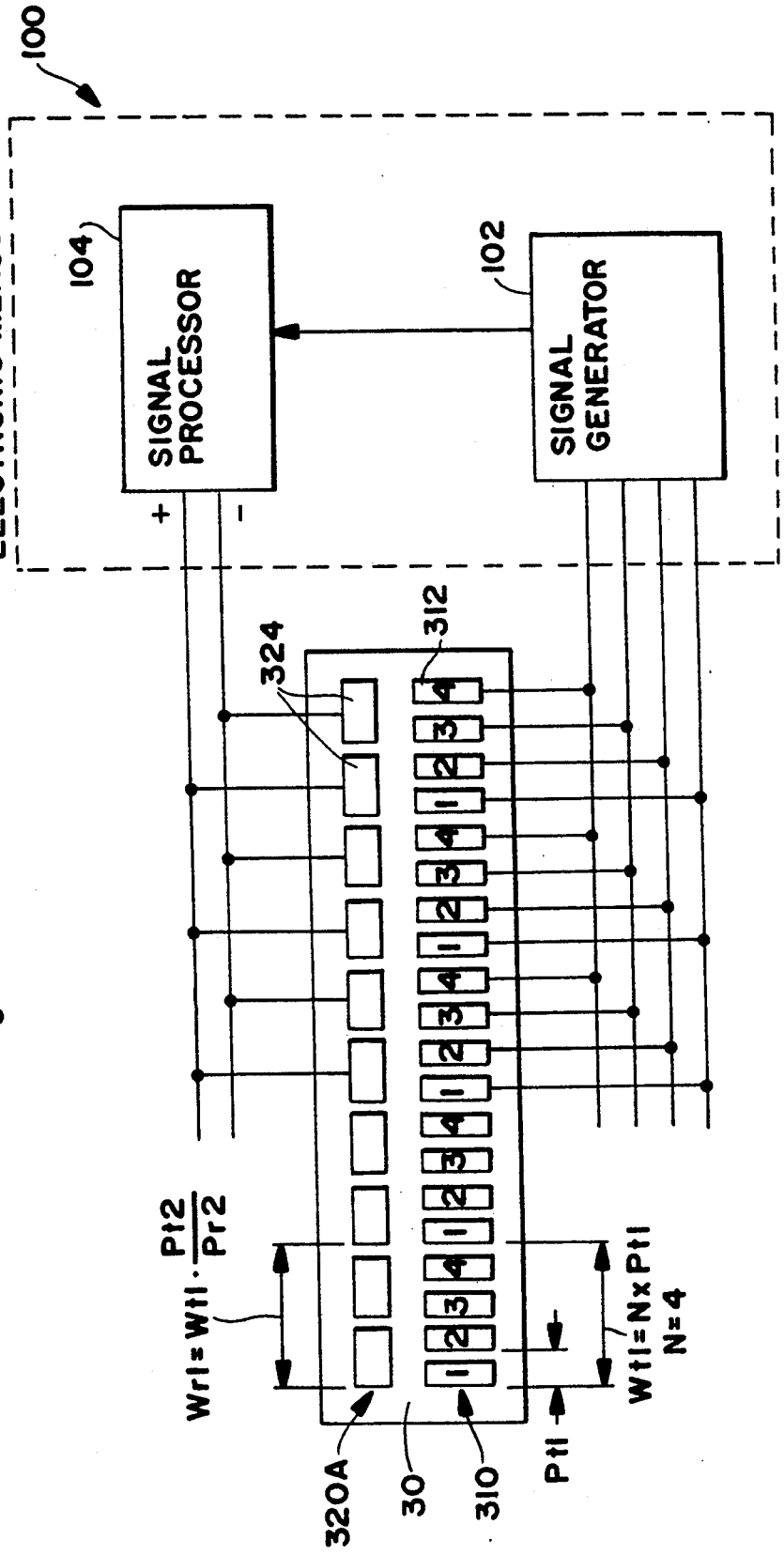

In the embodiments of FIGS. 1B and 4B, the direction of signal transmission through transducer 12 is reversed from that of the FIG. 1A and 4A embodiments, i.e., as is described in more detail hereinbelow, a plurality of periodically varying signals are applied to electrodes 322A, 322A', 322B, 322B' in combinations that are dependent on the type (coarse, medium, or fine) of measurement, and the resulting signals produced by electrode array 310 are sensed. Accordingly, for convenience of description with respect to the embodiments of FIGS. 1B and 4B, the electrodes of array 310 will be described as second receiver electrodes, the electrodes of arrays 210A and 210B will be described as second transmitter electrodes, the electrodes of arrays 220A and 220B will be described as first and third receiver electrodes, respectively, and the electrodes of arrays 320A and 320B will be described as first and third transmitter electrodes, respectively, in accordance with the respective functions of the electrode arrays in the transmission of signals from arrays 320A and 320B to array 310.

As shown, the physical configurations of the various electrode structures advantageously are the same regardless of the direction of signal transmission through transducer 12. Specifically, electrode arrays 210A and 210B disposed on support member 20 are identical, interleaved arrays which advantageously are formed, as shown, by two interleaved rows of discrete, electrically isolated electrodes 212A and 212B having identical, uniform geometries. Electrodes 212A are spaced apart from each other, and electrodes 212B are similarly spaced apart from each other, along the measurement axis by a uniform pitch $P_{r1}$ (corresponding edge to corresponding edge distance) defining a desired first receiver/second transmitter electrode wavelength $W_{r1}$ (scale or fine wavelength $W_f$).

Electrode array 310 disposed on support member 30 advantageously comprises a row of discrete electrodes 312 disposed in opposing alignment with electrode arrays 210A and 210B so as to be capacitively coupled to differing portions of the electrode arrays 210A and 210B depending on the relative positions of support members 20 and 30.

The relative spacing of the electrodes in the respective electrode arrays 310 and 210A/210B is based on several considerations. Coarse resolution measurements are made in accordance with the present invention in the embodiments of FIGS. 1A and 4A by applying N periodically varying excitation signals in numerical sequence to groups of N first transmitter electrodes 312, where N is equal to or greater than three, so as to create an electric field with a predetermined varying voltage distribution over a transmitter wavelength $W_{t1}$ corresponding to the pitch Pg (defined as the edge-to-edge distance between the leading electrodes in adjacent groups) of the first transmitter electrode groups. The first receiver electrode arrays 210A/210B need to have an electrode density relative to the first transmitter electrode array 310 sufficient to adequately sample the first transmitter electrode field over one transmitter wavelength $W_{t1}$ so that the voltage distribution over the portion of the first receiver electrode arrays 210A/210B capacitively coupled to the first transmitter electrode array 310 is substantially the same as the voltage distribution over the first transmitter array.

Further, in accordance with the present invention coarse resolution measurements are made in the embodiments of FIGS. 1B and 4B by connecting the N different outputs from each group of N electrodes comprising second receiver electrode array 310 in numeric sequence to the inputs of signal processor 104, where N is equal to or greater than three, so as to sense an electric field with a voltage distribution over a receiver wavelength $W_{t1}$ corresponding to the pitch Pg of the second receiver electrode groups. The second transmitter electrode arrays 210A/210B similarly need to have an electrode density relative to the receiver wavelength $W_{t1}$ sufficient to adequately create the second transmitter field over one receiver wavelength $W_t$.

Consequently, the density of electrode distribution in electrode arrays 210A/210B should be at least three electrodes 212A/212B over a distance corresponding to the transmitter/receiver wavelength $W_{t1}$. The pitch $P_{t1}$ of electrodes 312 is thus determined in part by the desired fine wavelength $W_f$ and the requirement that at least three electrodes 212A/212B be disposed within a wavelength $W_{t1}$.

In addition, in order to make fine measurements using the same electrode arrays and signal processing circuitry, the electrodes 312 are positioned within each electrode group so as to respectively occupy N group positions which each represent a different relative fine wavelength segment position obtained by dividing the wavelength $W_{t1}$ into a number of intervals corresponding to a fine wavelength $W_f$, and dividing each interval into N equal segments. This electrode arrangement allows the measurement direction width of the individual electrodes 312 to be significantly increased relative to the scale wavelength, and is described more fully in applicant's copending U.S. patent application entitled "Capacitive Type Measurement Transducer With Improved Measuring Element Arrangement," Ser. No. 07/200,580, which is hereby incorporated by reference.

Figure 2A:
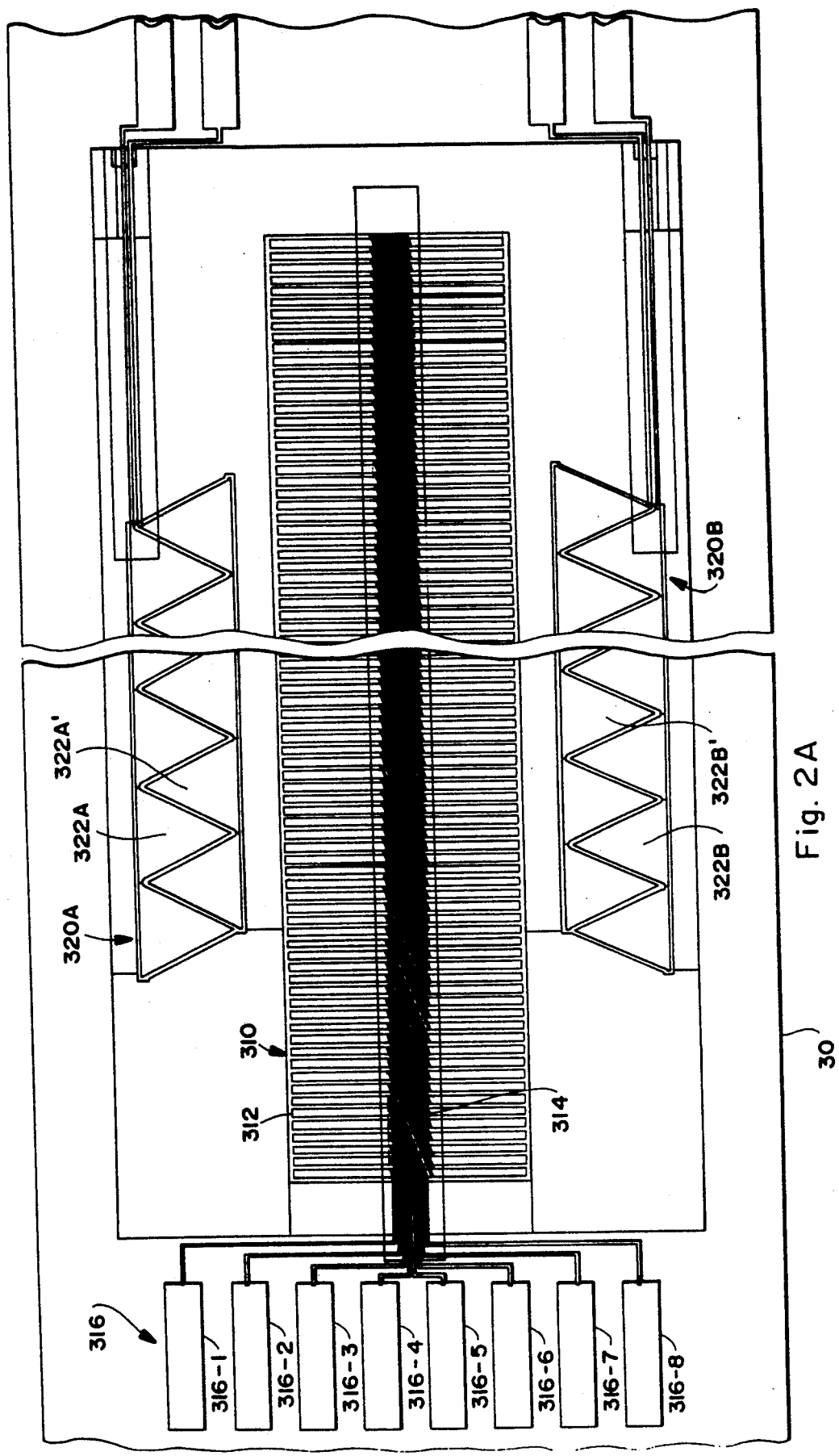
FIG. 2A is a partial top elevation view of one portion of a second embodiment of a transducer constructed in accordance with the present invention.
Figure 2B:
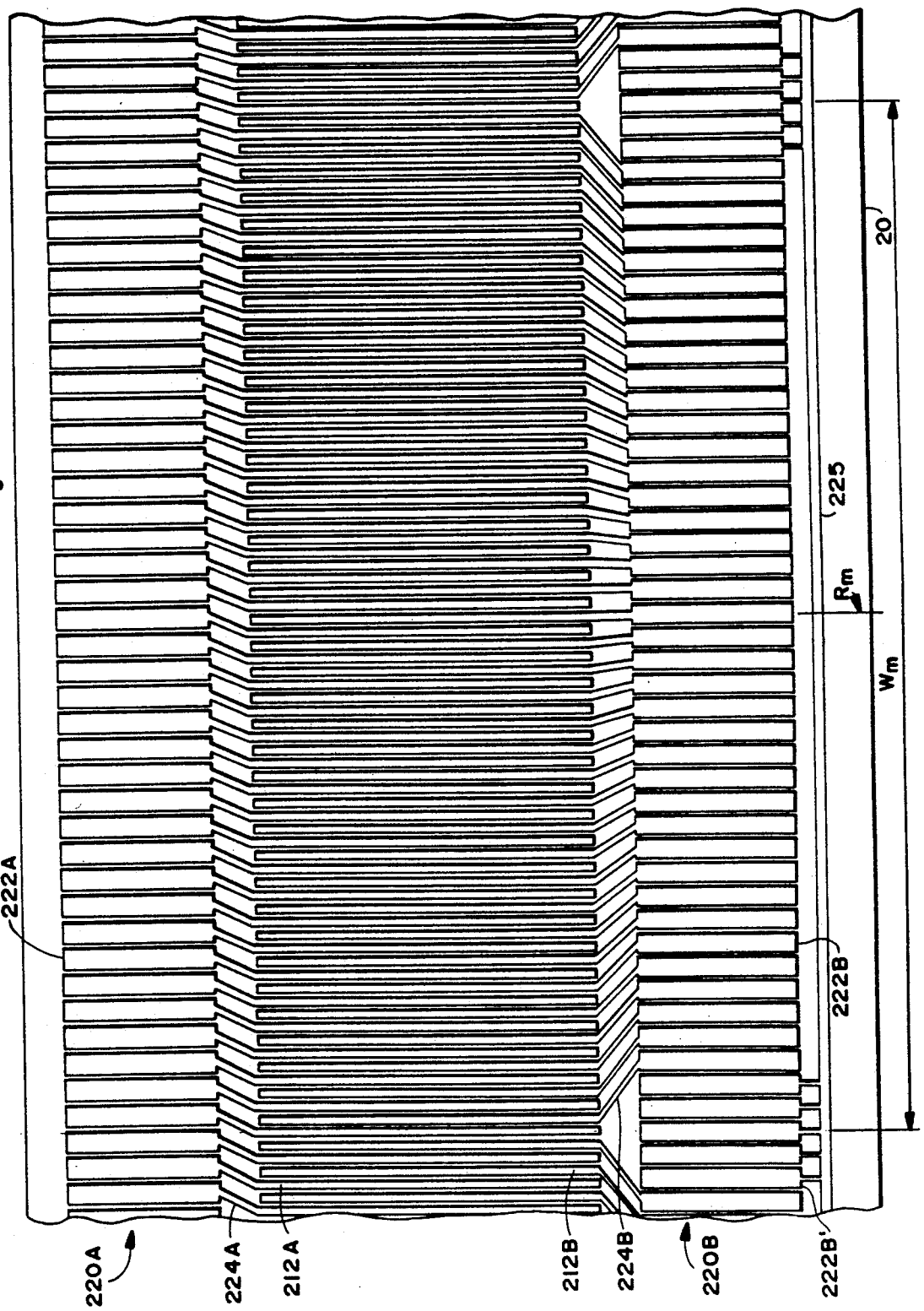
FIG. 2B is a partial top elevation view of another portion of the transducer shown in FIG. 2A.

As shown in FIG. 2A, the corresponding electrodes 312 in each group advantageously are electrically interconnected by connecting elements 314, and the electrodes 312 in one of the end groups are connected to corresponding transducer input terminals 316 for either applying the excitation signals to the respective electrodes 312 in each electrode group in a predetermined order according to the order in which the signals are connected to terminals 316 (FIG. 1A and 4A embodiments); or connecting the respective electrodes 312 in each electrode group in a predetermined order to signal processor 104 (FIG. 1B and 4B embodiments).

As shown in FIGS. 1A-1B and 2A-2B, electrode array 220A disposed on support member 20 comprises, as shown, a row of discrete electrodes 222A adjacent to, and in relative alignment with electrode array 210A on one side thereof. Each of the electrodes 222A is electrically connected via a connecting electrode 224A to a corresponding one of the electrodes 212A such that each electrode 222A is spatially offset or displaced from the corresponding electrode 212A relative to the measurement axis by an amount $D_c(x)$ which is a predetermined function of the position of the electrode 222A relative to a reference position $R_c$ on the measurement axis (not shown); and further such that the offset between the electrodes 222A and the corresponding electrodes 212A does not change by an amount exceeding the wavelength $W_{t1}$ over a predetermined maximum coarse measurement range or wavelength $W_c$ (not shown). Advantageously, the degree of electrode offset is a linear function which increases as the distance of an electrode 222A relative to the reference position increases, but it will be appreciated that the relationship between the electrode offset and the relative position of an electrode 222A can be any desired nonlinear function. Advantageously, electrodes 222A are spaced from each other by a uniform pitch $P_{t2}$ different than pitch $P_{r1}$, as shown, to provide a linear relationship between the electrode offset and electrode 222A relative position. With such an arrangement, the degree of offset $D_c(x)$ has the following relationship:

$$D_c(x) = (P_{t2} - P_{r1}) f(x)$$

$$f(x) = \frac{x}{P_{t2}}$$

$$D_c(x) = \left( \frac{P_{t2} - P_{r1}}{P_{t2}} \right) x$$

where x denotes the distance of an electrode 222A from the reference position.

Figure 3:
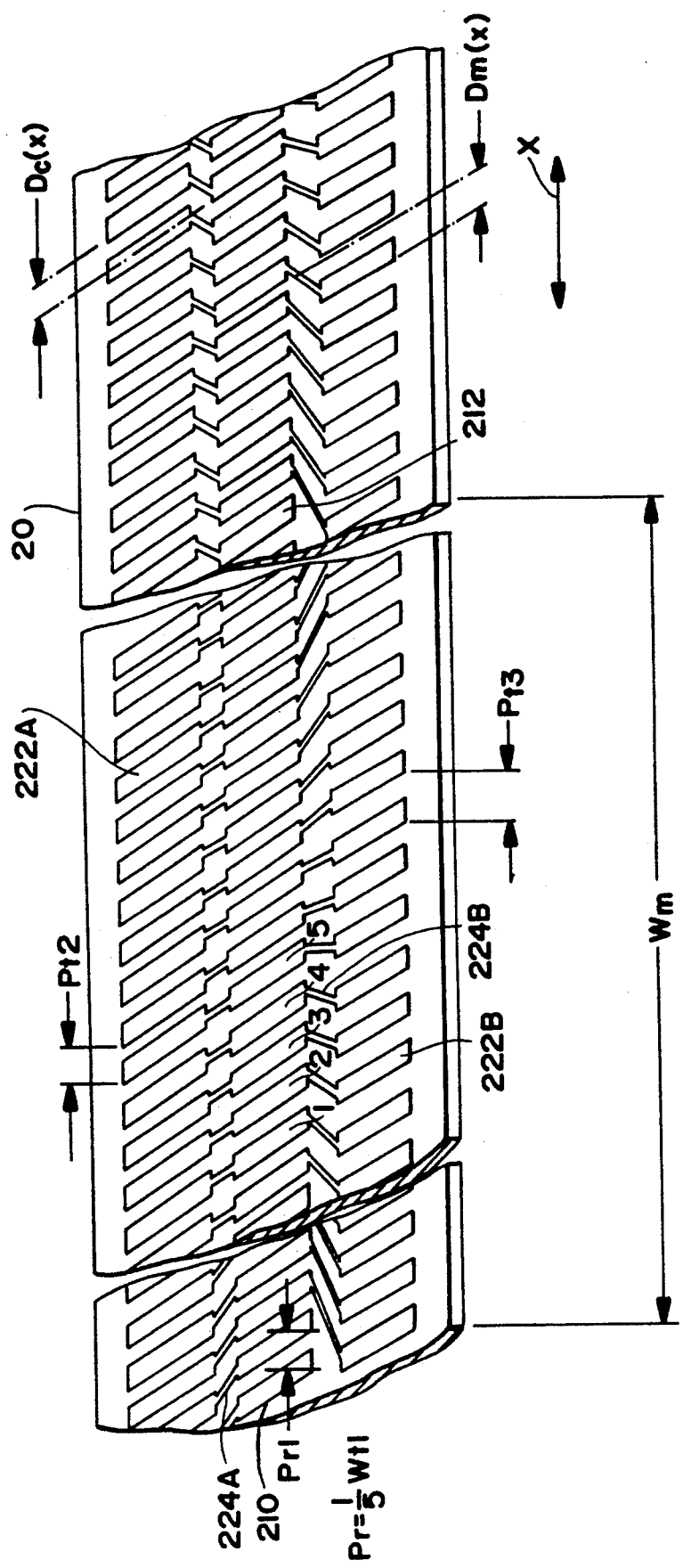
FIG. 3 is a partial perspective view of one portion of a third embodiment of a transducer constructed in accordance with the present invention.

It will also be appreciated that the reference position $R_c$ to which the degree of electrode offset is related can be located either at one end of the coarse wavelength $W_c$ of the caliper, as in the embodiment of FIGS. 1 and 2, or at an intermediate location, such as, for example, the mid-point, of the coarse wavelength $W_c$, as in the embodiment of FIG. 3. It will be appreciated that, in the arrangement of FIGS. 1 and 2, the degree of electrode offset is unique for each electrode pair, while in the arrangement of FIG. 3, electrodes 222A which are symmetrically disposed with respect to the reference position $R_c$ have the same degree of offset, but in opposite directions relative to the measurement axis, as shown. Thus in the embodiment of FIG. 3, the offset $D_c(x)$ varies between $+\frac{1}{2}$ of the wavelength $W_{t1}$ and $-\frac{1}{2}$ of the wavelength $W_{t1}$. An advantage of the symmetrical offset configuration of the FIG. 3 embodiment is that the maximum offset $D_c(x)$ is limited, which reduces the amount of slanting and the length of connecting electrodes 224, thus facilitating manufacture.

Electrode array 220B disposed on support member 20 comprises, as shown, a row of discrete electrodes 222B adjacent to, and in relative alignment with electrode array 210B on the side opposite from array 220A. Groups of 212B are electrically connected to corresponding groups of electrodes 222B via connecting electrodes 224B as shown. Within each group of interconnected electrodes 212B and electrodes 222B, the electrodes 222B are spatially offset from the associated electrodes 212B to which they are connected in the same manner as the electrodes 222A and electrodes 212A, i.e., the amount of offset $D_m(x)$ in each group is a predetermined function (linear or non-linear) of the position of the electrode 222B relative to a reference position $R_m$ on the measurement axis within the group, and the change in offset $D_m(x)$ over the measuring distance, i.e., medium wavelength $W_m$, spanned by each group of electrodes 222B is equal to the wavelength $W_{t1}$. Advantageously, as shown, the group reference position $R_m$ is located at the center of each group, and the offset $D_m(x)$ within each group varies symmetrically with respect to the reference position between $+\frac{1}{2}$ of the wavelength $W_{t1}$ and $-\frac{1}{2}$ of the wavelength $W_{t1}$. Additionally, the medium wavelength should preferably have a length that is an integral number of wavelengths $W_{t1}$. The groups are repeated with a pitch equal to the medium wavelength $W_m$.

Advantageously, the coarse wavelength $W_c$ should be an integral multiple of the medium wavelength $W_m$, and the medium wavelength $W_m$ should be an integral multiple of the fine wavelength $W_f$. Additionally, the medium wavelength $W_m$ should have a length which is an integral multiple of the wavelength $W_{t1}$. A coarse resolution measurement needs to determine in which medium wavelength the measurement position is located, and a medium resolution measurement needs to determine in which fine wavelength the measurement position is located. Consequently, the accuracy of a medium measurement must be better than one fine wavelength, and the accuracy of a coarse measurement must be better than one medium wavelength.

Accordingly, the relationships between the coarse, medium and fine wavelengths $W_c$, $W_m$ and $W_f$ should be selected to provide a good margin of accuracy. For example, in the embodiment of FIG. 2, with N equal 8, $W_c=40W_m$ and $W_m=40W_f$, an interpolation resolution for coarse and medium measurements of 1/320 would allow the coarse measurement to determine measurement positions within $\frac{1}{8}$ of a medium wavelength, and the medium measurement would be able to determine positions within $\frac{1}{8}$ of a fine wavelength. This is a very good margin to the maximum allowed error of less than one wavelength. In a practical design $W_f=1.024$ mm, and the fine interpolation resolution is $W_f/512$, or 2 microns. The total absolute measurement range is thus $40\times40\times1.024$ mm = 1638 mm = 1.64 meters, with a resolution of 2 microns over the entire range.

Advantageously, electrodes 222B are uniformly spaced from each other by a pitch $P_{t3}$, such that the offset $D_m(x)$ for an electrode 222B is a linear function of the relative position of the electrode within the group. As shown in FIGS. 1 and 3, respectively, the pitch $P_{t3}$ may be such that the distance spanned by a group of transmitter electrodes 222B (the medium wavelength $W_m$) is less than (FIG. 1) or more than (FIG. 3) the distance spanned by the associated group of electrodes 212B to which the electrodes 222B are connected. In the case of the FIG. 1 arrangement, it will be appreciated that every electrode 212B can be connected to a corresponding electrode 222B, but that not every electrode 222B can be connected to a corresponding electrode 212B. It will also be appreciated that the converse is true in the case of the FIG. 3 arrangement. At least in the case of the FIG. 1 arrangement, it has been found to be desirable to connect to a grounded conductor 225 (FIG. 2) those electrodes 222B' which are not connected to electrodes 212B.

Electrode array 320A disposed on support member 30 advantageously comprises two electrodes 322A, 322A' having complementary configurations which are disposed adjacent each other and in opposing alignment with electrode array 220A. As shown, electrodes 322A, 322A' have an elongate, periodically varying shape relative to the measurement axis, and the effective length of electrodes 322A, 322A' is substantially an integral multiple of the wavelength $W_{t1}$, and preferably an integral multiple of the wavelength $W_{t1}$ multiplied by a correction factor $P_{t2}/P_{r1}$. From the standpoint of signal processing, electrodes having a sinusoidally varying shape, as shown in FIG. 1, are preferred. However, a triangular configuration, as shown in FIG. 2, or a rectangular configuration can also be used. One form of rectangular configuration is shown in FIGS. 4A and 4B, wherein electrode array 320 comprises a row of discrete rectangular electrodes 324 which are disposed on support member 30 in opposing alignment with electrode array 220A. Electrodes 324 have a uniform pitch and are connected alternately as positive and negative inputs to the signal processing circuitry 104 (FIG. 4A) or the signal generating circuitry 102 (FIG. 4B), as shown. The electrodes 324 thus collectively have a periodic configuration relative to the measurement axis, with a predetermined wavelength $W_{r2}$ as described more fully herein below.

In the embodiments of FIGS. 1A and 4A, when N incrementally different periodically varying signals (or a group phase combination of signals as described hereinbelow) are applied in numerical sequence to each group of N first transmitter electrodes 312 according to the respective physical positions of corresponding ones of the electrodes in the group, the resultant electric field distribution over the first transmitter electrodes 312 has a wavelength $W_t$, and this field distribution is capacitively coupled to the first receiver electrodes 212A, and thereafter via connecting electrodes 224 to the second transmitter electrodes 222A with an offset $D_c(x)$ along support member 20 which varies according to the distance of each second transmitter electrode from the reference position $R_c$. Similarly, in the embodiments of FIGS. 1B and 4B, when the output of an excitation signal generator is connected differentially to electrodes 322A and 322A', the capacitive coupling between first transmitter electrode array 320A and first receiver electrode array 220A is distributed sinusoidally over a wavelength $W_{r2}$, and an electric field imaging this coupling distribution is created on second transmitter electrode array 210A, and subsequently sensed by second receiver electrode array 310. The position of the electric field on second transmitter electrode array 210A corresponds to the sinusoidal electrode pattern of electrode array 320 (having the wavelength $W_{r2}$) but offset from the electrode 320 pattern along the measurement axis by an amount $D_c(x)$ that is a function of the distance of each second transmitter electrode 212A from the reference position $R_c$. The geometric structure of second receiver electrodes 322A and 322A' (324), when the terminals thereof are connected differentially (either to signal processor 104 or signal generator 102), functions as a spatial filter that emphasizes the $W_t$ component of the capacitive transfer function, while depressing the $W_f$ component, so that the electric field component which is dependent on the electrode offset $D_c(x)$ is detected. Since offset $D_c(x)$ is correlated to the relative positions of the support members by reason of the relationship of the offset to a predetermined reference position on support member 20, as described hereinabove, an absolute position measurement can be determined from a measurement indicative of $D_c(x)$ and knowledge of the function $D_c = f(x)$. In the preferred embodiments wherein the offset $D_c(x)$ is a linear function, this can be readily accomplished by configuring the electrodes 322A and 322A' so as to have a periodicity or receiving/transmitting wavelength $W_{r2}$ that detects/creates the electric field component having a wavelength of one wavelength $W_{t1}$ normalized for the difference in pitch between the electrodes 212A and the electrodes 222A. That is, the electrodes 322A and 322A' are configured so as to sense/create the electric field pattern over a wavelength $W_{r2}$ having the following relationship to the wavelength $W_{t1}$:

$$W_{r2} = W_{t1}(P_{t2}/P_{r1}).$$

Electrode array 320B is configured similarly to electrode array 320A and is disposed in opposing alignment with electrode array 220B. In particular, the electrodes 322B of array 320B are configured similarly to the electrodes of array 320A so as either to sense the electric field pattern produced by the electrodes 222B (FIG. 1A and 4A embodiments), or to create an electric field pattern (FIG. 1B and 4B embodiments), over a wavelength $W_{r3}$ having the following relationship to the wavelength $W_{t1}$:

$$W_{r3} = W_{t1}(P_{t3}/P_{r1}).$$

As shown in FIG. 3, a single array 210 of electrodes 212 may advantageously be employed in lieu of the dual arrays 210A and 210B shown in FIG. 1. In the embodiment of FIG. 3, electrodes 220A are connected to one end of electrodes 212, and electrodes 220B are connected to the opposite end of electrodes 212, as shown. In addition, as shown in FIG. 1, electrodes 212 advantageously may have a sinus-shaped configuration, such that the space between the electrodes forms a substantially full-wave sinusoidal curve extending parallel to the measurement axis.

In the fine measurement mode, the terminals of electrodes 322A and 322A' are electrically connected together. Consequently, electrode array 320A effectively functions as a unitary rectangular electrode extending over an integral number of wavelengths $W_{t1}$. Similarly, the output terminals of electrodes 322B, 322B' are electrically connected together to also form an effective unitary rectangular electrode 320B extending over an integral number of wavelengths $W_{t1}$. A signal coupled from a first transmitter electrode 312/320A through the first receiver electrodes 212A/220A and the associated second transmitter electrodes 222A/210A to the second receiver electrode array 320A (322A and 322A' combined)/310 will vary periodically as a function of the displacement x between the support members 20 and 30, relative to a reference position of the two support members, with a wavelength equal to the wavelength $W_{r1}$ of the first receiver/second transmitter electrode array 210A.

Similarly, a signal coupled between an electrode 312 through electrodes 212B and the associated electrodes 222B and the electrode array 320B will follow a similar periodic function 180 degrees out of phase to the signal produced by the electrode array 320A.

The shape of these signal transfer functions between an electrode 312 and the fine mode configurations of the electrodes 320A/320B is dependent on the shapes of the electrodes 312 and 212. If the respective electrodes are rectangular in shape, the transfer function is a composite of triangular waveshapes for small gaps between the support members 20 and 30, and becomes sinusoidal as the gap increases. By making electrodes 212 sinusoidal in shape, as shown in FIG. 1, a sinusoidal transfer function is obtained independent of the gap dimension between the support members.

For a first one of the electrodes 312, the above described fine mode transfer function, $T_{f1}$, can be mathematically expressed as:

$$T_{f1} = C_{fo} + C_f \sin \frac{2\pi x}{W_f}$$

where $C_{fo}$ = a constant capacitance value and $C_f$ = the amplitude of a variable capacitance value.

For a second one of the electrodes 312, spaced a distance d (in the X-axis measurement direction) from the aforementioned first one of the electrodes 312, the fine mode transfer function $T_{f2}$ can be expressed as a function of d relative to the $T_{f1}$ transfer function as follows:

$$T_{f2}(d) = C_{fo} + C_f \sin \frac{2\pi(x - d)}{W_f}$$

With the spacing d between electrodes 312 selected as hereinabove and in applicant's aforementioned copending application incorporated by reference, the electrodes 312 in a group of N electrodes are distributed over several fine wavelengths $W_f$, and the spacing $d_n$ between the first one and the nth one of the electrodes 312 in a group can be defined as:

$$d_n = n(W_f/N) + (M_n)(W_f)$$

where $M_n$ is an integer corresponding to the scale wavelength interval in which the nth electrode of the group is located.

For fine measurements, the factor $M_n$ can have any integer value because:

$$\sin(V + M2\pi) = \sin(v) \text{ if } M = \text{integer.}$$

A transfer function for the electrode 312 in each "phase" position within the group can thus be defined independently of M as:

$$T_n = C_{fo} + C_f \sin\left(2\pi\left(\frac{x}{W_f} - \frac{n}{N}\right)\right).$$

This means that the N electrodes 312 in a group constitute N "phase" electrodes having sinusoidal transfer functions that are phase-shifted with respect to each other by 360/N degrees.

In the coarse and medium measurement modes for the embodiments of FIGS. 1A and 4A, the outputs of the second and third receiver electrodes 320A and 320B are connected differentially, i.e., the coarse measurement signal which is processed is the difference of the signals from second receiver electrodes 322A and 322A', and the medium measurement signal which is processed is the difference of the signals from third receiver electrodes 322B and 322B'. In the coarse and medium measurement modes for the embodiments of FIGS. 1B and 4B, the inputs of the first and third transmitter electrodes 320A and 320B are respectively connected differentially to positive and negative outputs of signal generator 102. That is, in the coarse mode, electrodes 322A and 322A' are respectively connected to positive and negative signal generator outputs; and in the medium mode, 322B and 322B' are respectively connected to the positive and negative signal generator outputs. Referring specifically to the coarse measurement mode (the medium measurement mode description is analogous), for the case of electrodes 322A, 322A' configured so as to be separated from each other by a sinusoidal dividing line, as shown in FIG. 1, the capacitance between an electrode 222A and electrode 322A is defined as a function of the relative displacement x between the support members as:

$$C(x) = C_{co} + C_c \sin\left(2\pi\left(\frac{x}{W_{f2}} - \frac{n}{N}\right)\right),$$

where $C_{co}$ = a constant capacitance value and $C_c$ = the amplitude of a variable capacitance value.

For the complementary electrode 322A', the corresponding capacitance function is defined as:

$$C'(x) = C_{co} - C_c \sin\left(2\pi\left(\frac{x}{W_{f2}} - \frac{n}{N}\right)\right)$$

Differentially combining the capacitance functions produces $$C^*(x) = C(x) - C'(x) = 2C_c \sin\left(2\pi\left(\frac{x}{W_{f2}} - \frac{n}{N}\right)\right).$$

The transfer function for a signal transferred between a first one of the electrodes 312, via the electrodes 212A and electrodes 222A, and the electrodes 322A, 322A' is a combined function of the fine wavelength modulation produced by electrodes 212A, and the above defined capacitance functions:

$$T_{c1}(x) = $$

$$\left(C_{fo} + C_f \sin\left(\frac{2\pi x}{W_f}\right)\right)\left(C_{co} + C_c \sin\left(\frac{2\pi D(x)}{W_c}\right)\right) -$$

$$\left(C_{fo} + C_f \sin\left(\frac{2\pi x}{W_f}\right)\right)\left(C_{co} - C_c \sin\left(\frac{2\pi D(x)}{W_c}\right)\right) =$$

$$\left(C_{fo} + C_f \sin\left(\frac{2\pi x}{W_f}\right)\right)\left(2C_c \sin\left(\frac{2\pi D(x)}{W_c}\right)\right).$$

A second one of the electrodes 312 that is N/2 phase positions away from the aforementioned first one of the electrodes 312 will have both its fine and coarse sinus functions inverted, and its transfer function to the electrodes 322A, 322A' will be:

$$T_{c2}(x) = -\left(C_{fo} - C_f \sin\left(\frac{2\pi x}{W_f}\right)\right)\left(2C_c \sin\left(\frac{2\pi D(x)}{W_c}\right)\right).$$

Transferring a signal between the second one of the electrodes 312 and electrodes 322A, 322A' that is the inverse of the signal transferred between the first one of the electrodes 312 and electrodes 322A, 322A' produces the following resultant transfer function for the combination of the two electrodes 312:

$$T_c(x) = T_{c1}(x) - T_{c2}(x) = 4(C_{fo})(C_c)\left(\sin\left(\frac{2\pi D(x)}{W_c}\right)\right).$$

The combined transfer function is thus independent of the fine wavelength modulation of the electrodes 212, and is dependent solely on the offset D(x) between electrodes 212 and the associated electrodes 222A, which dependence can be used to make coarse position measurements.

From the foregoing, it will be appreciated that the transducer electrode arrangement of the present invention can be utilized as a spatial filter, the filter function of which is readily alterable by changing its geometry through different electrical connections of the electrodes 322A, 322A' and 322B, 322B' to extract the desired component of the transducer geometry (either the fine wavelength modulation of the electrodes 212, or the adjusted wavelength $W_t$ signal distribution over the electrodes 320A, 320B indicative of the offset D(x)); and to reject the other component.

As noted hereinabove, the electrodes 322A, 322A' and 322B and 322B' can have different configurations, with the result that the dividing line between the associated electrodes of each electrode array can be other than sinusoidal, e.g., triangular or rectangular. Such alternative electrode arrangements will also provide the spatial filtering described hereinabove, and in general will do so as long as the transfer function between the electrodes 220A, 220B and the associated electrodes 320A, 320B satisfies the condition that:

$$C(x) = C(x - W_{f2}/2)$$

It will also be appreciated that the spatial positions of the respective transducer output signal waveforms relative to a reference position are also dependent on the relative positions of the transducer support members 20 and 30 with respect to each other, which is the basic relationship that enables the measurement position to be determined by measuring temporal signal phase shifts.

In accordance with the present invention, absolute position measurements are derived from a combination of at least a coarse resolution measurement and a fine resolution measurement based on the foregoing principles. Advantageously a combination of a coarse, a medium, and a fine resolution measurement are utilized to obtain precise absolute measurements over an extended measuring range. Multiple measurements are obtained from the same electrode arrays in the embodiments of FIGS. 1A and 4A by applying excitation signals in predetermined sequences or phase combinations to the first transmitter electrodes 312 and connecting the second/third receiver electrode 320A, 320B outputs to provide the appropriate spatial filtering according to the different measuring modes; and in the embodiments of FIGS. 1B and 4B by connecting the N outputs from the second receiver electrodes 310 to signal processor 104 in predetermined sequences or phase combinations, and connecting the first/third transmitter electrodes 320A/320B to signal generator 102 to provide the appropriate spatial filtering for each measurement mode. The geometrical arrangement of electrodes 310 and 220A/220B is such that it is possible to obtain N distributed phase positions for a capacitance function having a fine wavelength; and also N distributed phase positions having a longer wavelength which extends over several fine wavelengths, and which carries coarse and medium position information via the respective offsets $D_c(x)$ and $D_m(x)$ between the electrodes 210A, 210B and the electrodes 220A and 220B, respectively.

The different transfer functions described above are essentially capacitance functions, and the absolute position within each measuring wavelength $W_c$, $W_m$ and $W_f$ can, for each measuring mode (coarse, medium and fine), be measured in the embodiments of FIGS. 1A and 1B with a number of different, previously known circuits for capacitive position measurements. Examples include the circuit described in applicant's aforementioned copending application incorporated herein by reference; and the circuits described in applicant's aforementioned U.S. Pat. No. 4,420,754, which is hereby incorporated herein by reference. Such circuits, which are based on continuous excitation of the transmitter electrodes with cyclic signals of different phase positions, evenly distributed over the N inputs, and a receiver and evaluation circuit based on measurement of the relative phase position of the resulting composite signal, can be readily used in the embodiments of FIGS. 1A and 4A (where electrodes 312 constitute first transmitter electrodes to which the excitation signals are applied) with the following qualifications:

a) If the selected transducer electrode geometry is one that uses the same excitation signal sequence connection for all measuring modes, coarse, medium and fine measurements can be done concurrently by three parallel circuits of the above mentioned kind, and the absolute position value can be calculated from the output data from those measurements.

b) If the selected transducer electrode geometry is one that requires different excitation signal connection sequences for fine measurements and for medium/coarse measurements, the measurements must be multiplexed in time between the measurement modes.

c) If the three measuring modes coarse, medium and fine are multiplexed sequentially through the same measuring circuit, sufficient time must be allowed, for each measuring mode, for the signals to obtain a steady state condition (allow for time constantst in filters and integrators) before a measurement value is taken.

Figure 5:
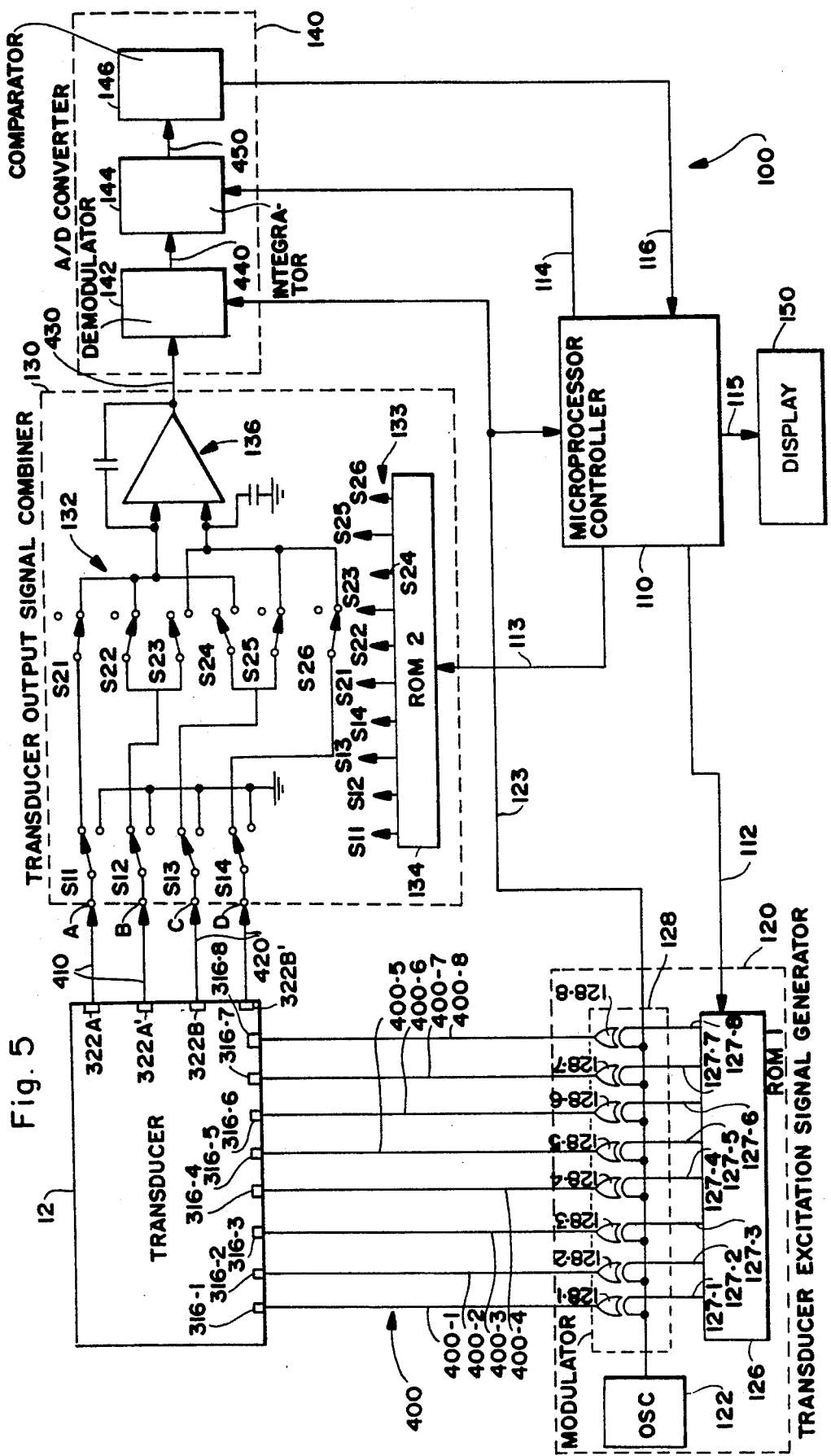
FIG. 5 is a schematic block diagram of a first exemplary embodiment of a measuring circuit in accordance with the present invention which is adapted for the caliper embodiments of FIGS. 1A and 4A.

A preferred embodiment of electronic measuring apparatus 100 for the caliper embodiments of FIGS. 1A and 4A is shown in FIG. 5 which has the advantages of being faster than the aforementioned continuous signal phase measurement method, and being able to multiplex between measurement modes through a common electronic measuring circuit without the need for settling time between the three modes. In general the apparatus of FIG. 5 measures ratios of transducer output signals produced by different "group phase" combinations of excitation signals in each measuring mode with a dual ramp analog-to-digital (A/D) conversion method.

For purposes of clarity, the following description will be with reference to an exemplary embodiment of transducer 12 having an electrode configuration as shown in FIG. 2 and the following parameters:

Wavelengths:
$W_f = 1.024$ mm
$W_m = 40\ W_f = 40.096$ mm
$W_c = 40\ W_m = 1638.4$ mm
First transmitter electrode pitch $P_{t1} = \frac{5}{8} (W_f)$ Number of excitation signal "group phase" combinations $N = 8$
Excitation signal connection sequence for each group of N first transmitter electrodes:
Coarse/Medium measurement mode: 1-2-3-4-5-6-7-8
Fine Measurement mode: 1-6-3-8-5-2-7-4

As shown, the electronic measuring apparatus of FIG. 5 comprises a microprocessor controller 110 for controlling the operation of the other components and doing necessary calculations in combining the measurement data; a transducer excitation signal generator 120 for producing predetermined group phase combinations of excitation signals 400 responsive to control signals 112 produced by controller 110; a transducer output signal combiner 130 responsive to control signals 113 produced by controller 110 for selectively connecting the outputs 410 of the second receiver electrode array 320A and the outputs 420 of the third receiver electrode array 320B in different combinations to produce resultant transducer output signals 430 for subsequent processing depending on the measurement mode, as discussed more fully hereinbelow; a dual-ramp A/D converter 140 responsive to control signals 114 for converting the amplitude ratios of pairs of successive resultant transducer output signals 430, which correspond to different transmission paths through the transducer, to time intervals T from which position measurements in each measurement mode can be derived by controller 110; and a display 150 responsive to output signals 115 produced by controller 110 for displaying the values of the positions calculated by controller 110. As shown in FIG. 5, transducer excitation signal generator 120 advantageously comprises a clock oscillator 122 for producing a high frequency square wave clock signal 123 having a frequency $f_o$; and a modulator 128 for producing predetermined sequences (i.e., group phase combinations) of inverted and noninverted signals 123 as transducer excitation signals 400. Preferably, the clock frequency $f_o$ is selected so that each clock cycle corresponds to the phase shift represented by one increment of the desired fine wavelength resolution. Advantageously, as shown, modulator 128 comprises an array of N exclusive-OR logic gates 128-1 to 128-8, each gate having one input connected to the clock signal 123 and the other input connected to a gate control signal 127-1 to 127-8 produced by a read-only memory 126 (ROM1) in response to controller control signals 112. As shown in the table of FIG. 6, control signals 112 advantageously are four bit binary words, the values of which, as defined by bits U, V, W and F/MC, determine which of sixteen different group phase combinations of ROM1 outputs 127-1 to 127-8 are produced, with eight being used for the fine (F) measurement mode (bit F/MC=1)

and eight being used for the medium (M) and coarse (C) measurement modes (bit F/MC=0). (As will be appreciated by those skilled in the art, when a gate control signal 127 is low (0), the excitation signal produced by the associated gate 128 is the clock signal 123, and when a gate control signal is high (1), the excitation signal produced is inverted relative to signal 123.)

As shown in FIG. 5, the respective excitation signals 400 produced by excitation signal generator 120 advantageously are connected in fixed consecutive numerical sequence to corresponding ones of the transducer input terminals 316-1 to 316-8, to which are respectively connected the first transmitter electrodes in each group of N electrodes according to the relative order in which the electrodes are physically arranged in the group, as opposed to the order of the relative fine wavelength segment (phase) positions occupied by the group electrodes. That is, the first signal 400-1 is applied to the first transmitter electrode 312-1 in each group, the second signal 400-2 is applied to the second transmitter electrode 312-2 in each group, and so on, with the Nth signal 400-N being applied to the Nth transmitter electrode 312-N in each group. Accordingly, in the coarse and medium modes, the various group phase combinations consist of sequences of four consecutive noninverted and four consecutive inverted excitation signals, with the electrodes to which the noninverted and inverted signals are applied in each group being successively shifted by one electrode group phase position from one group phase combination to the next. That is, for group phase combination K=1 shown in FIG. 6, transducer input terminals 316-1 to 316-4 are fed with non-inverted excitation signals, while terminals 316-5 to 316-8 are fed with inverted excitation signals. For the next successive group phase combination (K=2), terminals 316-2 to 316-5 are fed with non-inverted signals and terminals 316-6 to 316-1 are fed with non-inverted signals; and so on.

In contrast, in the fine measurement mode, because of the electrode geometry used in the illustrative example, the same group phase combinations of excitation signals 400 must be applied to the first transmitter electrodes in each group according to the relative phase position (fine wavelength segment position) of each electrode within the group. With the fixed connection of the excitation signal generator outputs 400 to the transducer input terminals, this necessitates the generation of the second set of group phase combinations shown in FIG. 6 for the fine mode, which reflects the relation of each input terminal 316 to a relative fine wavelength segment position as follows:

| Terminal Number | Electrode Segment Position |
|---|---|
| 316-1 | 1 |
| 316-2 | 6 |
| 316-3 | 3 |
| 316-4 | 8 |
| 316-5 | 5 |
| 316-6 | 2 |
| 316-7 | 7 |
| 316-8 | 4 |

It will be appreciated that the outputs 400 of excitation signal generator 120 could advantageously alternatively be connected to the transducer input terminals 316 through a controllable interface circuit which determines the sequence in which the respective excitation signals are applied to the input terminals, in which case only one set of group phase combinations of excitation signals need be generated. It will also be appreciated that for other transducer electrode geometries, such as, e g., N=8 and $W_{t1}=9W_{r1}$, the sequence of relative fine wavelength segment positions occupied by the first transmitter electrodes in each group is the ascending numerical sequence 1-2-3-4-5-6-7-8, and thus that the same set of group phase combinations can be used in those cases both for coarse/medium and for fine measurements.

As shown in FIG. 5, transducer output signal combiner 130 advantageously comprises an electronic switching network, generally denoted 132, responsive to binary switch control signals 133 produced by a read-only memory 134 (ROM2) in response to two bit word controller signals 113 indicating the measurement mode, and a differential amplifier circuit 136 connected to the outputs of switching network 132 and producing resultant transducer output signals 430 as an output. As shown, switching network 132 has four input terminals A, B, C and D, to which are respectively connected the transducer outputs 410 and 420. Switches S11, S12, S13, S14, S21, S22, S23, S24, S25 and S26 are responsive to control signals 133, as shown in FIG. 7, such that a switch is in the up position shown in FIG. 5 (e.g., switch S11) when the corresponding control signal is high ("1" in FIG. 7), and is in the down position shown in FIG. 5 (e.g., switch S21) when the corresponding control signal is low ("0" in FIG. 7). Switches S11-S26 are interconnected as shown such that the resultant signals 430 constitute the following combinations of inputs in response to the switch control signals 133 having the values shown in FIG. 7 for each of the three measurement modes:

FINE: Signal $430=(A+B)-(C+D)$
MEDIUM: Signal $430=C-D$
COARSE: Signal $430=A-B$ A/D converter 140 comprises, as shown in FIG. 5, a synchronous demodulator 142, which is controlled by the same clock signal 123 used to generate excitation signals 400, for producing a demodulated DC transducer signal 440 that is proportional to the amplitude of the resultant transducer output signal 430 produced by signal combiner 130; an integrator 144 responsive to control signals 114 for dual-ramp integrating pairs of transducer signals 440, as will be described in more detail hereinbelow; and a comparator 146 for detecting the polarity and zero crossings of the integrated output signals 450 produced by integrator 144 and producing feedback signals 115 for use by controller 110, as will be described in more detail hereinbelow.

Figure 8A:
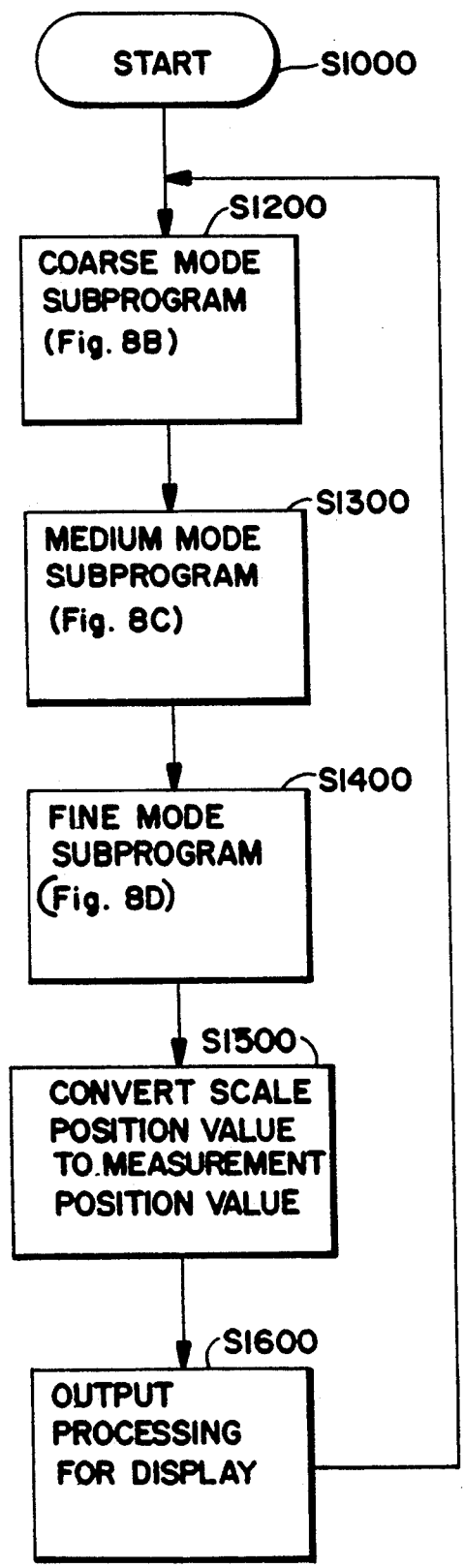

Controller 110 is programmed to control transducer excitation signal generator 120, transducer output signal combiner 130 and A/D converter 140; and to process the measured data for obtaining a position value in accordance with the flow charts shown in FIGS. 8A–8E. Referring to FIG. 8A, which illustrates the master measurement program controlling a position measurement, when the controller 110 is activated in a conventional manner to commence a measurement (Step S1000), coarse, medium and fine mode measurement subprograms (Steps S1200, S1300 and S1400) are successively performed to obtain coarse, medium and fine resolution scale position values $M_c$, $M_m$ and $M_f$. As will be explained in more detail hereinbelow, the medium and fine mode measurement subprograms each operate to cause correction, as appropriate, of the scale position value obtained from the previous level of measurement. Once the final values of the three scale position values $M_c$, $M_m$ and $M_f$ have been obtained after completion of the fine mode measurement subprogram, the scale position values are converted (Step S1500) into an absolute position measurement value $M_p$. A measurement cycle is completed by performing conventional processing operations (Step S1600) associated with display of the position measurement value by display 170. For example, such operations can advantageously include correction of the position measurement value for any zero offset; conversion of the position measurement value to inches; conversion of the binary value to an appropriate output format; e.g., binary coded decimal (BCD); and conversion to the desired display format.

As is explained in more detail hereinbelow, the A/D conversion of the demodulated resultant transducer output signals 440 for each measurement mode is dimensioned for the illustrative example of transducer 12 so that each incremental change in the scale position value data has the following relation to relative displacement of the transducer supporting members with respect to the measurement axis:

Fine Mode: 1 data increment = 1024/512 = 2 microns $$\text{Medium Mode: 1 data increment} = 40 \times \frac{1024}{320} = 128 \text{ microns}$$

$$\text{Coarse Mode: 1 increment} = 40 \times \frac{1024}{320} = 5120 \text{ microns}$$

Accordingly, conversion of the scale position values to a corresponding position measurement value (step 1500) simply requires combining the three scale position values according to the following weighting formula:

$$M_p = 2M_f + 128M_m + 5120M_c.$$

Figure 8B:
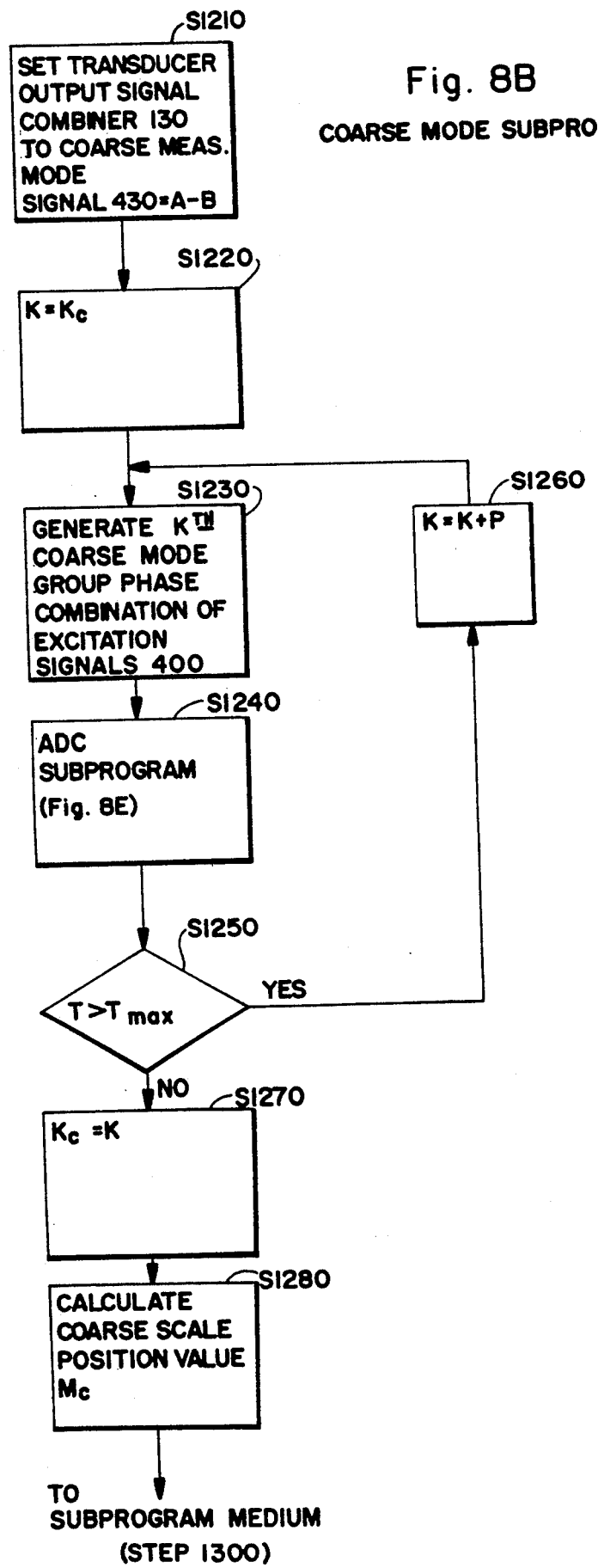
Figure 8C:
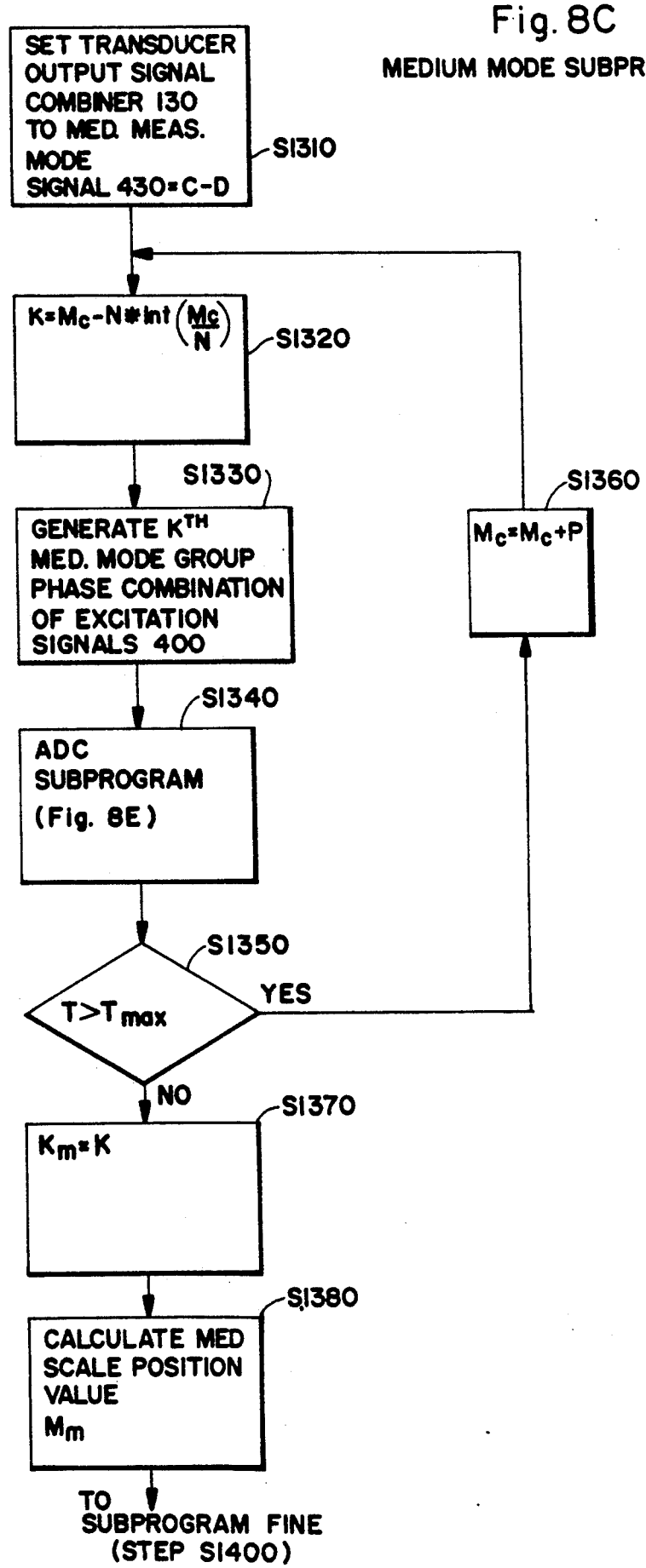
Figure 8E:
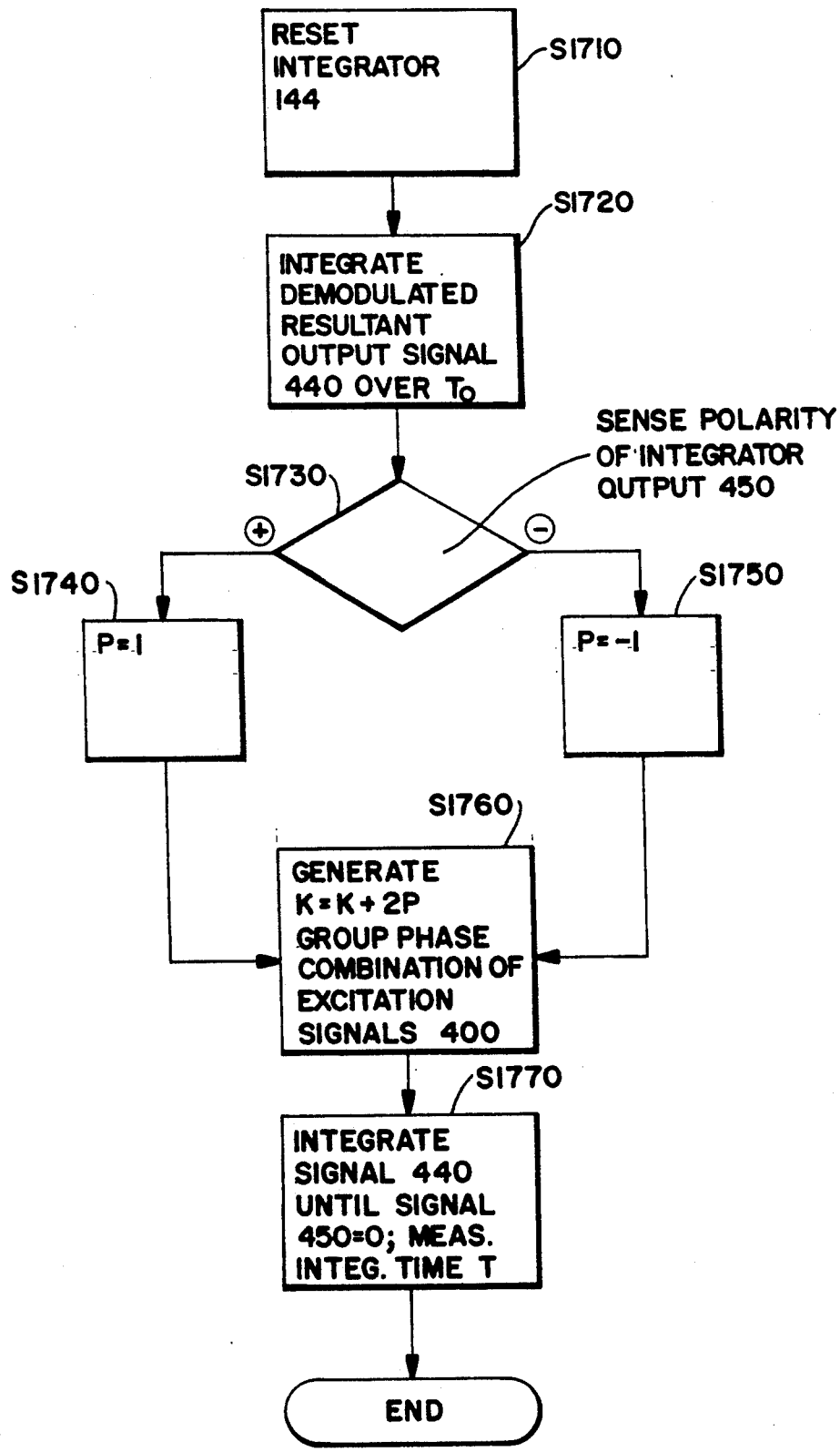

As indicated in FIGS. 8B-8D, in each of the three coarse, medium and fine measurement modes, the same A/D conversion (ADC) subprogram (steps S1240, S1340 and S1440, respectively) is performed. In each measuring mode, controller 110 initially selects a Kth one of the N possible group phase combinations of transducer excitation signals 400 to be generated, as will be described in more detail hereinbelow, and controls signal combiner 130 to produce the resultant transducer output signal 430 appropriate for the measurement mode. Referring to the flow chart of FIG. 8E, pursuant to the ADC subprogram controller 110 first causes integrator 144 to be reset to a predetermined "zero" output voltage (step S1710). (It will be appreciated by those of ordinary skill in the art that the zero level of the integrator is not necessarily an absolute zero voltage, but can be any voltage level that in the design of the circuits is selected to be the signal 0 level.) Controller 110 then causes the integrator to integrate the demodulated resultant transducer output signal 440 for a predetermined time period $T_0$ (step S1720). Controller 110 then checks (step S1730) the polarity of the integrator output 450 as sensed by comparator 146 (signal 116), and a polarity indicator constant P is set to a plus or a minus 1 value according to the sensed polarity (steps S1740 and S1750). Controller 110 then selects a new Kth group phase combination of transducer excitation signals 400 according to the value of K+2P (step S1760), and the demodulated resultant transducer output signal 440 produced by the new group phase combination of excitation signals is then integrated until the output of integrator 144 reaches zero as sensed by comparator 146 (step S1770). During the second integration, the integration time T is measured by an internal counter in the controller 110, which is incremented by clock signal 123 until the comparator output signal 116 indicates a zero integrator output. If the integrator output during the second integration interval does not reach zero within a predetermined time $T_{max}$, each of the measurement mode subprograms goes into a loop outside the ADC subprogram (step S1250, S1350, S1450) and changes the group phase combination of excitation signals used to generate the initial transducer output signal 440 integrated during the initial integration of the ADC subprogram (step S1720), as will be explained in more detail hereinbelow.

Figure 9:
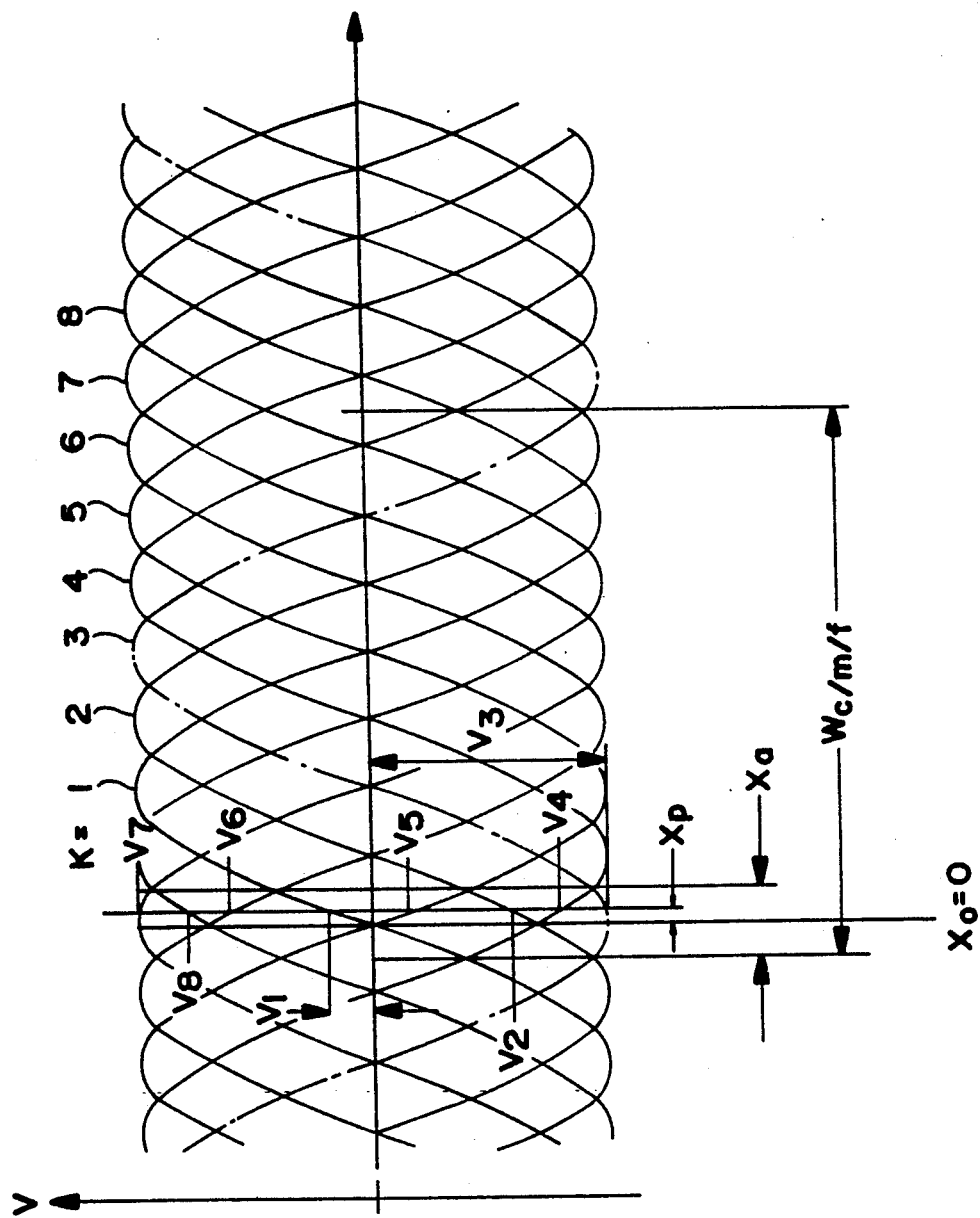
FIG. 9 is a graph showing the spatial relationship with respect to the measurement axis of transducer outputs produced in response to group phase excitation signal combinations generated by the measuring circuit of FIG. 5.

The objective of the ADC subprogram described hereinabove is to measure the ratio of i) one of the resultant transducer output signals that can be produced from the set of group phase combinations of excitation signals for a given measurement mode which produces a signal close to the zero-crossing for the above-described fine and coarse/medium transfer functions; and ii) a resultant transducer output signal for a transfer function that is one-quarter wavelength away from the initial signal. Referring to FIG. 9, if the actual measurement position $x_p$ is located relative to a zero-crossing position $x_o$ as illustrated, the first integration performed by integrator 144 with the K=1 group phase combination of excitation signals shown in FIG. 6 would produce an output voltage $$V_1 = V\sin\left(2\pi\left(\frac{x}{W} - \frac{1}{8}\right)\right);$$

where V equals the input voltage of the excitation signals 400, and W equals the coarse, medium or fine wavelength $S_c$, $W_m$ or $W_f$. During the first integration interval, the final output voltage of the integrator would be voltage $V_1$ multiplied by time $T_0$.

Referring to FIG. 9, voltage $V_1$ would be positive (P=1) and the next integration interval would be performed with the transducer output signal resulting from the K+2=3 group phase combination of excitation signals, which provides reverse integration of the integrator output. That is, the input voltage to the integrator would thus have an amplitude $V_3 = V\sin(2\pi(x/W - \frac{3}{8}))$, Since this signal is 90 degrees out of phase with the first signal, (negative in this example), the integrator output would decrease toward zero. When the integrator signal reaches zero at time T, $V_1T_0 - V_3T = 0$, and therefore $T = T_0(T_0(V_1/V_3))$. With $V_1$ and $V_3$ being sinusoidal functions of $x_p$, the relative position of the transducer support members with respect to a reference position, and $V_3$ being 90 degrees from $V_1$, the above equation for T is a tangens function:

$$T = T_0 \tan(2\pi(x/W - \tfrac{1}{8})).$$

This tangens function is reasonably linear up to an angle of 22.5 degrees (W/16). Therefore the value of T can be used as measurement data for further linear computations for determining the measurement position $x_p$ within this range. (If increased accuracy is required, the deviation of the tangens function from a linear function can be corrected in the subsequent computer processing.)

In order to take advantage of the above-mentioned linearity in the tangens function, a given group phase combination of excitation signals can be used for measurements only within a limited spatial range $X_a$, and the comparison of the second integration time T with a predetermined maximum value ensures that measurements are made within this range. If the time T exceeds the predetermined maximum, a new group phase combination of excitation signals is used for the initial integration, and the process is repeated until a second integration time T is obtained which is within the predetermined limit.

As a specific example, with the exemplary embodiment of transducer 12 described hereinabove, 320 (i.e. 40*8) scale position value data increments advantageously equal one coarse wavelength $W_c$ and one medium wavelength $W_m$ in the respective measurement modes; and 512 (64×8) scale position value increments equal one fine wavelength $W_f$ in the fine measurement mode A spatial range $X_a=(360/16)$ degrees thus corresponds to 320/16=20 data increments in the coarse and medium modes, and to 512/16=32 data increments in the fine measurement mode. Counts larger than these two values in the respective measurement modes are thus outside the spatial range $X_a$. Integration times $T_0$ and $T_{max}$ are accordingly set so that:

$T_{max}=20=T_0$ tan (360/16) for the coarse and medium measurement modes; and $T_{max}=32=T_0$ tan (360/16) for the fine measurement mode.

This relationship produces a value of 48 clock-cycles for $T_0$ in the coarse and medium measurement modes, and a value of 77 clock-cycles for the fine measurement mode.

Referring to FIG. 8B, the coarse measurement mode subprogram starts (step S1210) by generating the control signal 113 which sets transducer output signal combiner 130 to produce the resultant transducer output 430 appropriate for the coarse measurement mode as described hereinabove. Controller 110 next selects a group phase combination number K from among the coarse/medium combinations shown in FIG. 6 (step S1220). Preferably, following initial start up, the value of K is set equal to value of $K_c$ calculated during the previous coarse measurement. In most cases, when the rate of change of the measurement position value is not great, this selection criteria will result in an initial K-number very close to the correct value for the position being measured. In those cases where no previous K-value exists, such as, for example, at start up of the caliper following a power-off mode, an arbitrary value of K can be used as the initial value. The program will keep iterating through the coarse measurement mOde until the correct value of K has been reached.

Once the K-value has been selected, the corresponding group phase combination of transducer excitation signals are generated (step S1230) and the ADC subprogram described hereinabove is performed (step S1240). The value of second integration time T produced by the ADC subprogram is compared with the value of $T_{max}$ for the coarse measurement mode (20 for the exemplary embodiment described herein) (step S1250). For values of T larger than 20, the K-number is adjusted one step up or down dependent on the P value generated by the ADC subprogram (step S1260). Thereafter the measurement loop (steps S1230–S1260) is repeated again with the corresponding new K-number used to select the initial group phase combination of excitation signals used to generate the initial resultant transducer output signal 430. This process continues until a value of time T not greater than 20 is obtained from the ADC subprogram.

Next, a value $K_c$ is updated with the value of K for which the measurement time T was within the predetermined limit. The $K_c$ value will be used as the initial K value for the next coarse measurement, and is also used to obtain a value $M_c$ for the present coarse scale position. For the exemplary embodiment described herein:

$$M_c = 40\ K_c + PT.$$

In the case of the exemplary embodiment, $M_c$ can properly have values ranging from 0 to 319. When the computed value of $M_c$ is outside this range, controller 110 performs a "wrap-around" calculation, i.e., a calculated value of 321 equals a measurement value of 1, and a calculated value of $-3$ equals a measurement value of 317. By choosing the resolution of a coarse wavelength measurement to be 320, each increment of a $M_c$ value corresponds to $1/(40 \times 8) = 1$ phase-step (equals one K-increment in the medium measurement mode.

Referring to FIG. 8C, the medium measurement mode subprogram is substantially similar to the coarse mode subprogram. Controller 110 starts (step S1310) by generating a control signal 113 which sets the signal combiner 130 to produce the resultant transducer output signal 430 which is appropriate for medium measurements. Next (step S1320), the controller calculates the K-number of the group phase combination of excitation signals from the among the coarse/medium combinations shown in FIG. 6. Unlike the coarse mode subprogram, the medium mode subprogram uses the coarse scale position value $M_c$ obtained from the coarse mode computation according to the following formula $K = M_c - N(Int(M_c/N))$, where $Int(M_c/N)$ is the integer value of the ratio $M_c/N$.

Controller 110 then causes the K group phase combination of excitation signals to be generated and the ADC subprogram to be performed (steps S1330 and S1340). Similarly to the coarse mode subprogram, if the value of the second integration time T exceeds 20, the value of $M_c$ used to calculate K is adjusted one step up or down dependent on the P value produced by the ADC subprogram (step S1360). Thereafter the measuring loop (steps S1320–S1360) is repeated again with the corresponding new K-number. This process continues until a value of second integration time T within the predetermined limit is obtained from the ADC subprogram. The value of $K_m$ is updated (step S1370) and the medium scale position value $M_m$ is calculated (steps S1380) using (for the exemplary embodiment) the formula:

$$M_m = 40\ K_m + PT.$$

The medium measurement mode also utilizes a wrap-around computation similar to that employed in the coarse measurement mode to derive the value of $M_m$. Choosing 320 as the resolution for one medium wavelength makes one increment in the medium scale position value equal to $1/(40 \times 8) = 1$ phase step($=1$ K-increment) in the fine measurement mode.

Referring to FIG. 8d, the fine measurement mode subprogram is generally similar to the medium mode subprogram. Controller 110 starts (step S1410) by setting the signal combiner 130 to produce the resultant transducer output signal 430 which is appropriate for fine measurements. Controller 110 next calculates (step S1420) a K number for the initial group phase combination of excitations signals using the previously calculated medium scale position value Mm according to the following formula:

$$K = M_m - N(Int(M_m/N))$$

After causing the Kth group phase combination of excitations signals to be generated (step S1430), the ADC subprogram is performed as before (step S1440). Similarly to the course/medium measurement modes, if the calculated value of T exceeds limit $T_{max}$, the $M_m$ number used to calculate K is incremented by one step up or down dependent on the P value produced by the ADC subprogram (steps S1450 and S1460). If this adjustment causes the Mm value to pass the 319/0 value in an up or down direction (step S1462), the $M_c$ value is also incremented up or down by one increment accordingly. Thereafter, the measurement routine (steps S1420-S1464) is repeated again with the new K number, and the process continues until a value of time T within the limit $T_{max}$ is obtained from the ADC subprogram. Next the value of $K_f$ is updated with the last calculated value of K (step S1470) and the fine scale position value $M_f$ is then calculated (step S1480) using (for the exemplary embodiment) the formula:

$$M_f = 64K_f + PT.$$

With the dimensions provided in the illustrative example, the value $M_f$ can have values within the range 0–511. Similarly to the other two measuring modes, controller 110 performs a wrap-around computation if the calculated value of $M_f$ exceeds this range. For example, a calculated value of 513 equals a measurement of 1, and a calculated value of −3 equals a measurement value of 509. The choice of the resolution value of 512 for one fine wavelength $W_f$ makes one increment in a fine scale position measurement equal to $1/(64 \times 8) = 1/512$ of a fine wavelength, which equals two microns with the exemplary dimension of $W_f$ equal 1.024 $M_m$.

Conversion step S1500 of the master measurement program is carried out as described hereinabove using the values of $M_c$, $M_m$ and $M_f$ obtained from performing all three measurement mode subprograms. Thus, the initial value of $M_c$ obtained from performing the coarse mode subprogram may be subsequently modified in performing the medium and fine mode subprograms and the initial value of $M_m$ may be modified in performing the fine mode program, as described hereinabove. It will be appreciated that provision is made in the medium and fine measurement mode subprograms for successively correcting the higher wavelength measurement data based on the results from the lower wavelength data because there is some ambiguity in the least significant bits of the higher wavelength measurements, which bits in the next lower wavelength correspond to the K-number. In the lower wavelength measurement mode, the validity of the K-number is tested in the ADC subprogram with a higher level of accuracy. Accordingly, by reflecting in the higher wavelength measurement values any adjustment of the K-number in the lower wavelength conversions, the ambiguities in the higher wavelength measurements are resolved, and a correct position measurement value is obtained.

A preferred embodiment of electronic measuring apparatus 100' for the caliper embodiments of FIGS. 1B and 4B will now be described with reference to FIG. 10, wherein electrodes 320A constitute first transmitter electrodes, and electrodes 320B constitute third transmitter electrodes, to which the excitation signals are applied. As shown, the electronic measuring apparatus of FIG. 10 comprises a microprocessor controller 110' for controlling the operation of the other components and doing necessary calculations in combining the measurement data; a transducer excitation signal generator 120' responsive to control signals 112' produced by controller 110' for selectively connecting different combinations of excitation signals 400' to first transmitter electrode array 320A and third transmitter electrode array 320B; a transducer output signal combiner 130' responsive to control signals 113' produced by controller 110' for selectively combining predetermined group phase combinations of the outputs 410' of the second receiver electrode array 310 to produce resultant transducer output signals 430' for subsequent processing depending on the measurement mode, as discussed more fully hereinbelow; a dual-ramp A/D converter 140 responsive to control signals 114 for converting the amplitude ratios of pairs of successive resultant transducer output signals 430', which correspond to different transmission paths through the transducer, to time intervals T from which position measurements in each measurement mode can be derived by controller 110'; and a display 150 responsive to output signals 115 produced by controller 110' for displaying the values of the positions calculated by controller 110'.

Figure 10:
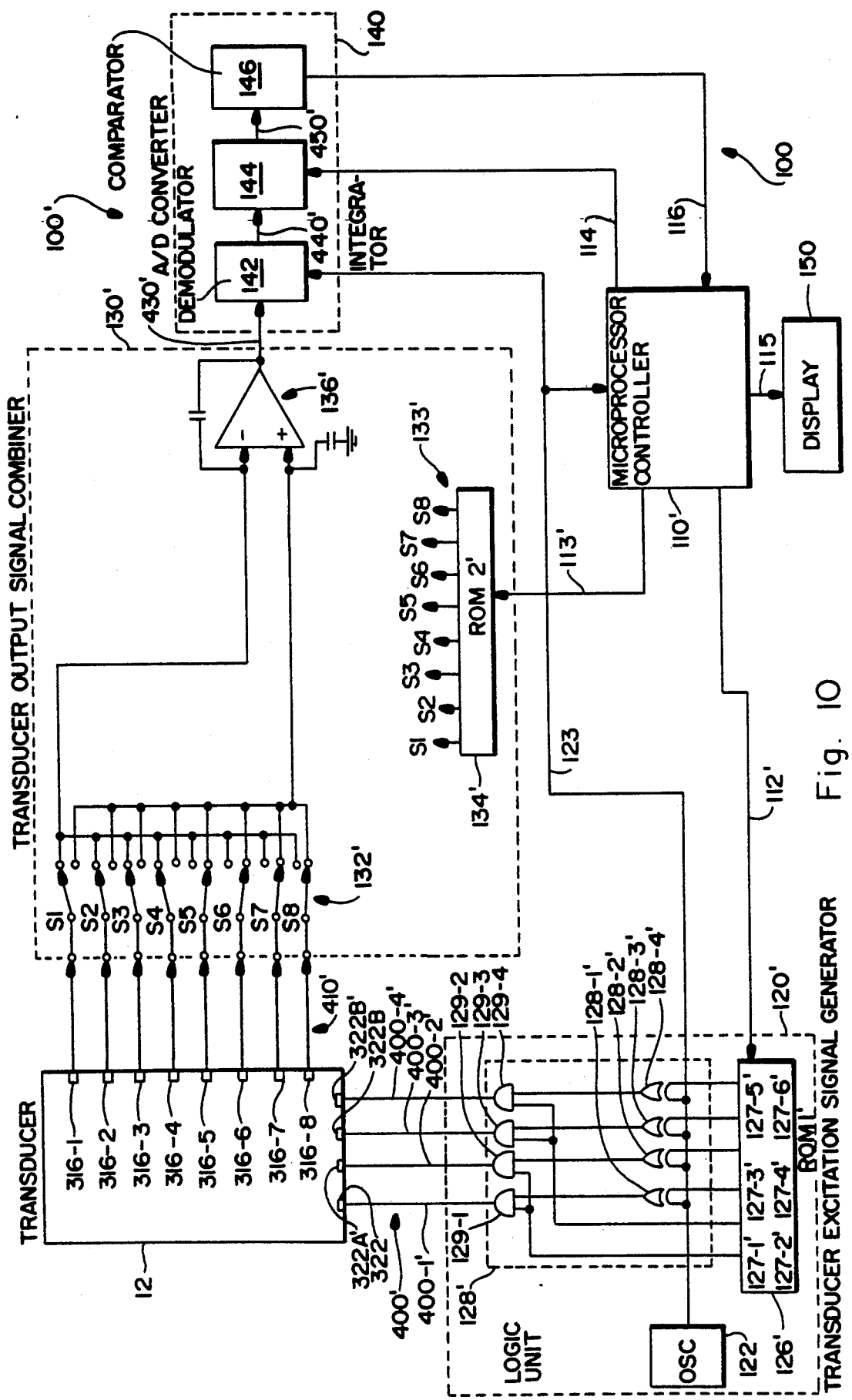
FIG. 10 is a schematic block diagram of a second exemplary embodiment of a measuring circuit constructed in accordance with the present invention which is adapted for the caliper embodiments of FIGS. 1B and 4B.

As shown in FIG. 10, transducer excitation signal generator 120' advantageously comprises a clock oscillator 122 for producing a high frequency square wave clock signal 123 having a frequency $f_o$; and a logic unit 128' responsive to the outputs of a read-only memory 126' (ROM1') controlled by controller control signals 112' for producing selected combinations of inverted and noninverted signals 123 as transducer excitation signals 400'. Preferably, the clock frequency $f_o$ is selected so that each clock cycle corresponds to the phase shift represented by one increment of the desired fine wavelength resolution. Advantageously, as shown, logic unit 128' comprises an array of four exclusive-OR logic gates 128-1' to 128-4' each having its output connected to one input of a corresponding AND gate 129-1 to 129-4. AND gates 129-1 to 129-4 have their outputs respectively connected to the transducer terminals for electrodes 322A, 322A', 322B and 322B'. Gates 129-1 and 129-2 each has a second input connected to a gate control signal 127-1' produced by a read-only memory 126' (ROM1') in response to controller control signals 112'. Gates 129-3 and 129-4 similarly each has a second input connected to a gate control signal 127-2' produced by ROM1'.

Each exclusive-OR gate 128-1' to 128-4' has one input connected to the clock signal 123 and the other input connected to a further gate control signal 127-3' to 127-6', respectively, produced by ROM1'. As shown in the table of FIG. 11, control signals 112' advantageously are two bit binary words, the values of which determine which combinations of ROM1' outputs 127-1' to 127-6' are produced. As shown, in the FINE mode, all of the AND gates 129-1 to 129-4 are enabled, so that excitation signals 400-1' to 400-4' are respectively applied to first transmitter electrodes 322A and 322A' and third transmitter electrodes 322B and 322B', with excitation signals 400-1, and 400-2, being noninverted and excitation signals 400-3' and 400-4' being inverted. In the MEDIUM mode, only AND gates 129-3 and 129-4 are enabled, so that only excitation signals 400-3' and 400-4' are respectively applied to third transmitter electrodes 322B and 322B', with excitation signal 400-3' non-inverted and excitation signal 400-4' inverted. In the COARSE mode, only AND gates 129-1 and 129-2 are enabled, so that only excitation signals 400-1' and 400-2' are respectively applied to first transmitter electrodes 322A and 322A', with excitation signal 400-1' non-inverted and excitation signal 400-4' inverted. The table of FIG. 11B summarizes the polarity relationships of the excitation signals 400-1' to 400-4' for each measurement mode.

As shown in FIG. 10, transducer output signal combiner 130' advantageously comprises an electronic switching network, generally denoted 132', responsive to binary switch control signals 133' produced by a read-only memory 134' (ROM2') in response to controller signals 113' indicating the measurement mode; and a differential amplifier circuit 136' connected to the outputs of switching network 132' and producing resultant transducer output signals 430' as an output. As shown, switching network 132' has N (8 in the embodiment shown) switches S1–S8, to which are respectively connected the transducer outputs 410 produced at second receiver electrodes terminals 316-1 to 316-8. Switches 132-1' to 132-8' are responsive to control signals 133', as shown in the table of FIG. 12, such that a switch is in the up position shown in FIG. 12 (e.g., switches 132-1' to 132-4') when the corresponding control signal is high ("1" in FIG. 12), and is in the down position shown in FIG. 12 (e.g., switches 123-5' to 132-8') when the corresponding control signal is low ("0" in FIG. 12) Switches 132-1' to 132-8' have two outputs, one corresponding to the up position, connected to the negative input of amplifier 136'; and one, corresponding to the down position, connected to the positive input of amplifier 136'. As shown in FIG. 12, control signals 113' advantageously are four bit binary words, the values of which, as defined by bits U, V, W and F/MC, determine which of sixteen different group phase combinations of ROM2' outputs are produced, with eight being used for the fine (F) measurement made (bit F/MC=1), and eight being used for the medium (M) and coarse (C) measurement modes (bit F/MC=0).

As discussed above, the transducer input terminals 316-1 to 316-8 are respectively connected to the second receiver electrodes 312 in each group of N electrodes according to the relative order in which the electrodes are physically arranged in the group, as opposed to the order of the relative fine wavelength segment (phase) positions occupied by the group electrodes. Switches S1–S8 are connected in fixed numerical sequence to transducer terminals 316-1 to 316-8, so that switch S1 is connected to the first receiver electrode 312-1 in each group, the second switch S2 is applied to the second receiver electrode 312-2 in each group, and so on, with the Nth switch S8 being applied to the Nth receiver electrode 312-8 in each group. Accordingly, in the coarse and medium modes, the various group phase combinations consist of sequences of transducer output signals 410' from four consecutive second receiver electrodes 312 in each group being connected to the negative input of amplifier 136', and transducer output signals 410' from four other consecutive second receiver electrodes 312 in each group being connected to the positive input of amplifier 136', with the respective transducer output signals connected to each amplifier input being successively shifted by one electrode group phase position from one group phase combination to the next. That is, for group phase combination K=1 shown in FIG. 12, transducer output signals from 316-1 to 316-4 are connected to the negative input of amplifier 136, while the output signals from terminals 316-5 to 316-8 are connected to the positive input of amplifier 136'. For the next successive group phase combination (K=2), the output signals from terminals 316-2 to 316-5 are connected to the amplifier negative input and the output signals from terminals 316-6 to 316-1 are connected to the amplifier positive input; and so on.

In contrast (similarly to the embodiments of FIGS. 1A and 4A), in the fine measurement mode, because of the electrode geometry used in the illustrative example, the same group phase combinations of transducer output signals 410' from the second receiver electrodes 312 in each group must be connected to the respective inputs of amplifier 136' according to the relative phase position (fine wavelength segment position) of each electrode within the group. With the fixed connection of switch network 132' to the transducer output terminals 316, this necessitates the generation of the second set of group phase combinations shown in FIG. 12 for the fine mode, which reflects the relation of each output terminal 316 to a relative fine wavelength segment position as follows:

| Terminal Number | Electrode Segment Position |
|---|---|
| 316-1 | 1 |
| 316-2 | 6 |
| 316-3 | 3 |
| 316-4 | 8 |
| 316-5 | 5 |
| 316-6 | 2 |
| 316-7 | 7 |
| 316-8 | 4 |

A/D converter 140 is identical to the A/D converter shown in FIG. 5, and hence will not be described in further detail.

Figure 13A:
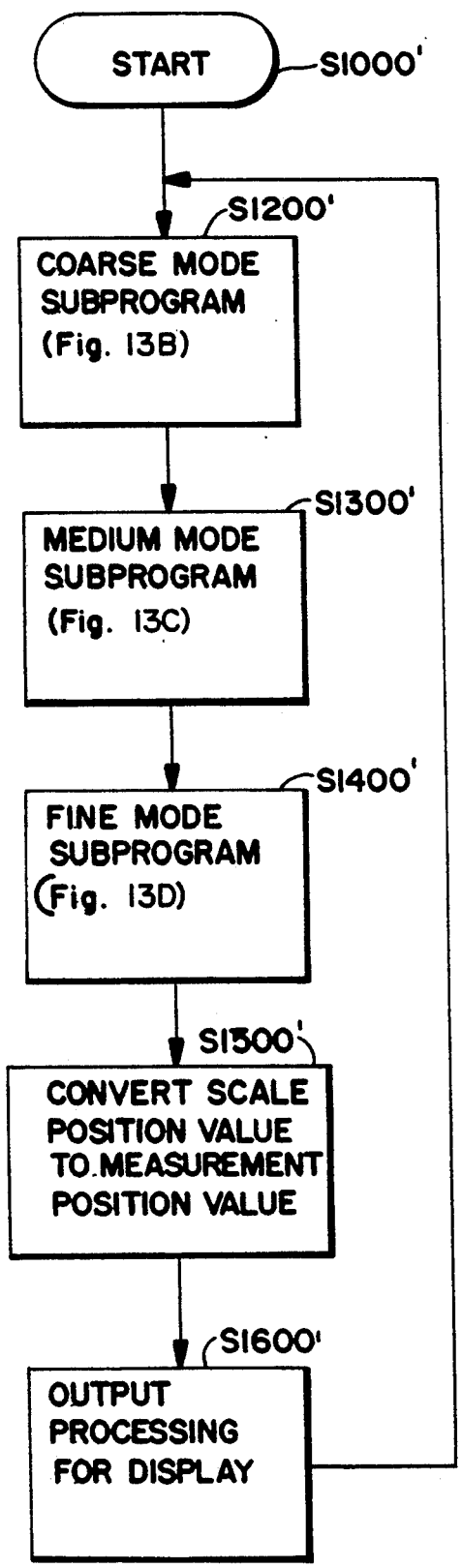

Controller 110' is programmed to control transducer excitation signal generator 120', transducer output signal combiner 130' and A/D converter 140; and to process the measured data for obtaining a position value in accordance with the flow charts shown in FIGS. 13A–13E. Referring to FIG. 13A, the master measurement program controlling a position measurement is identical to that shown in FIG. 8A, and hence will not be described in further detail.

Figure 13C:
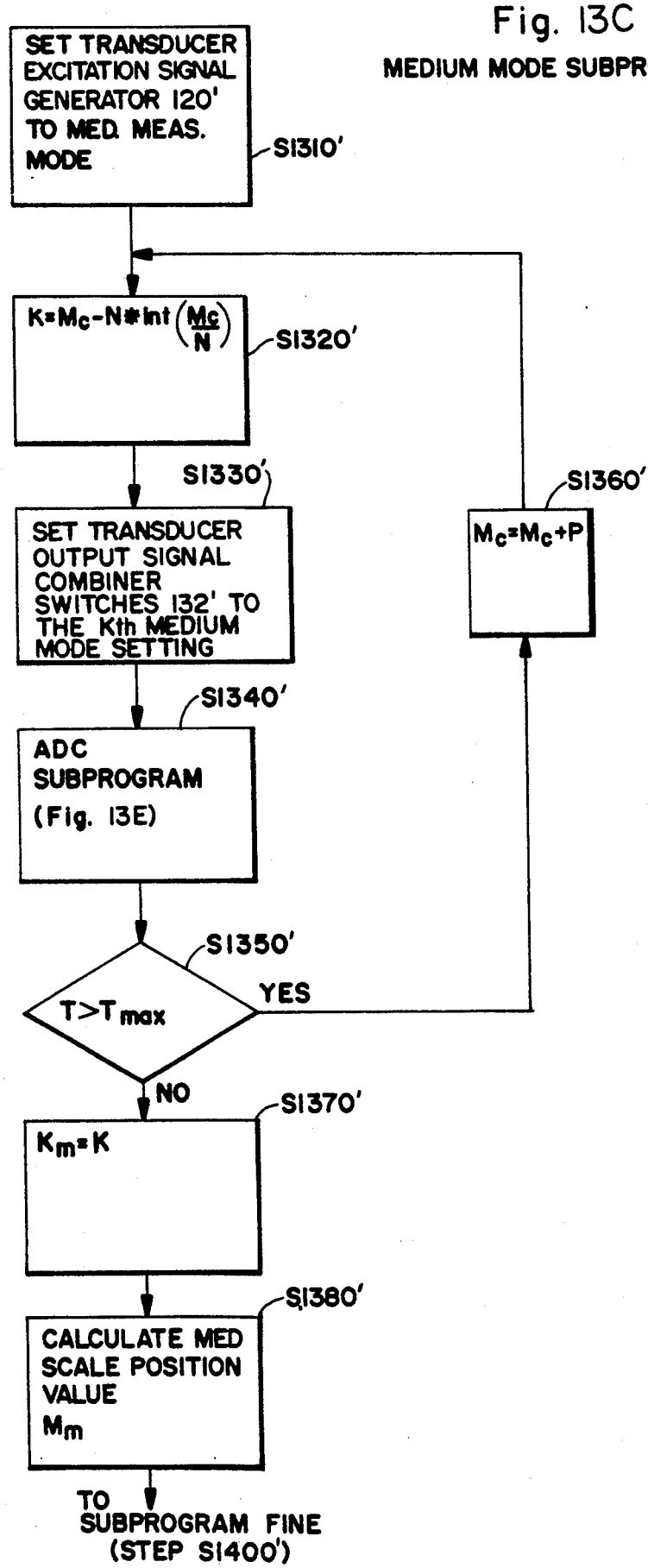
Figure 13D:
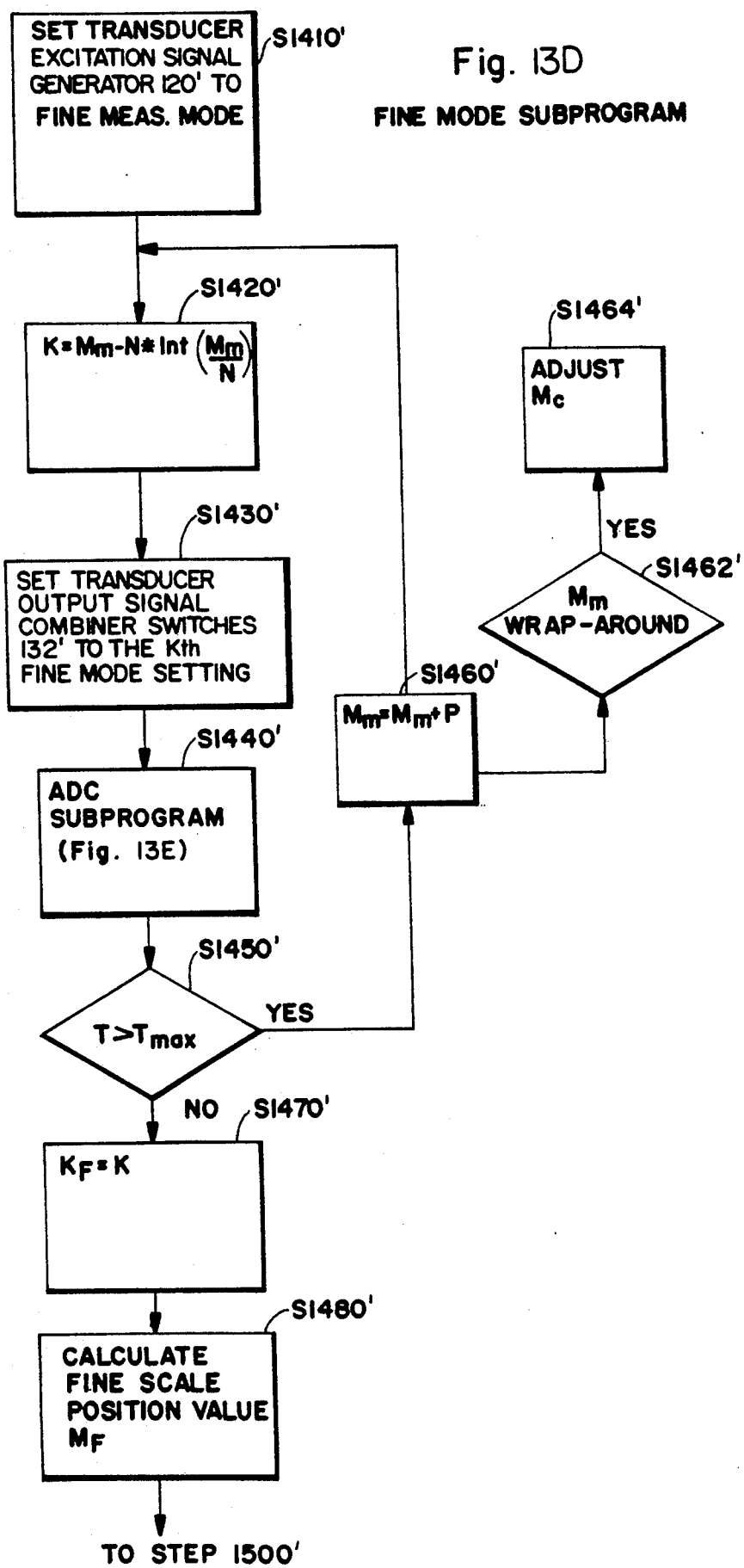
Figure 13E:
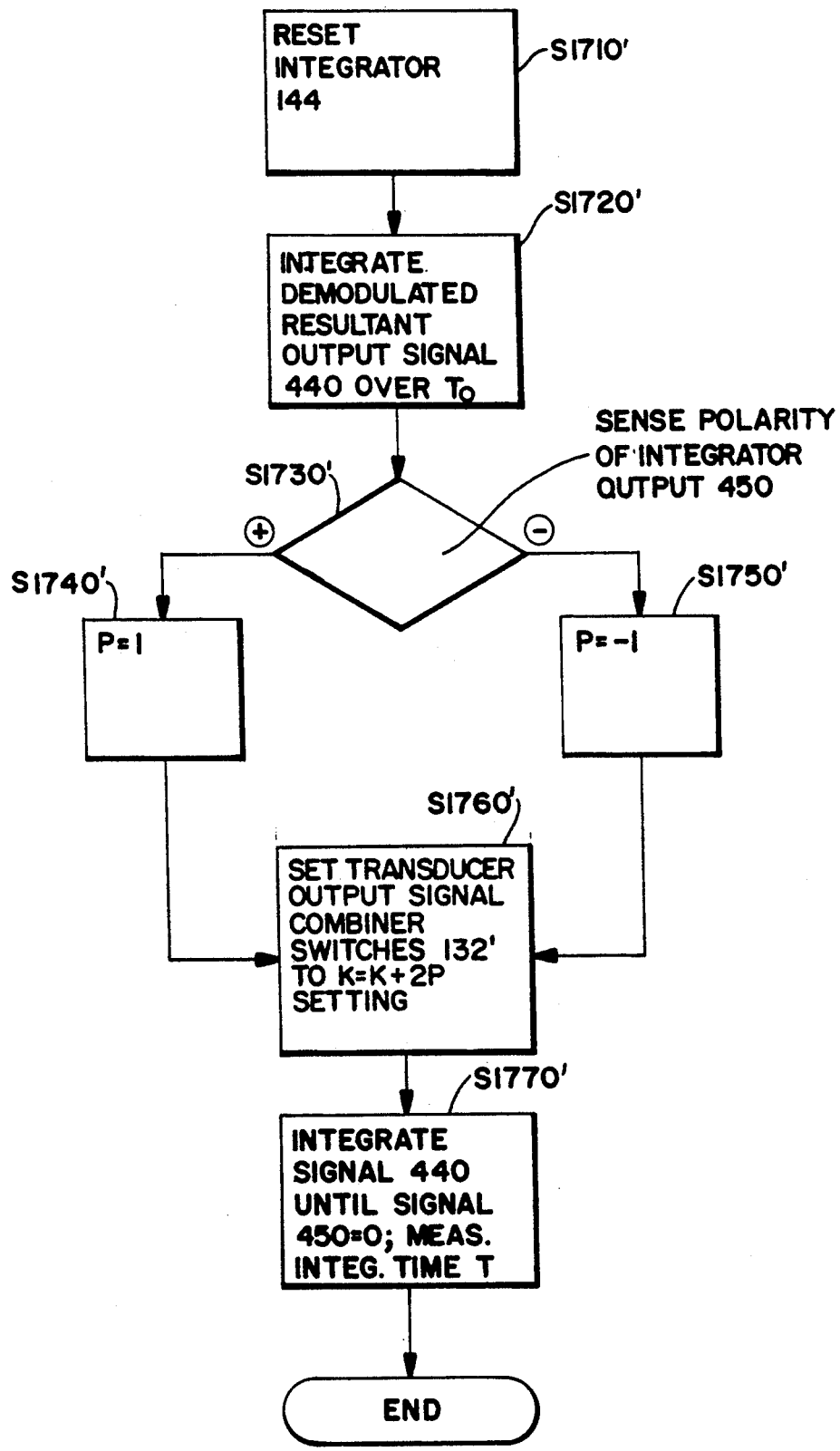

Generally, the coarse, medium and fine mode subprograms of FIGS. 13B–13D, and the ADC subprogram of FIG. 13E, are also similar to the subprograms of FIGS. 8A–8E, with the exception that the transducer outputs 410, are selectively connected in the predetermined group phase combinations to the respective inputs of amplifier 136' in the subprograms of FIGS. 13B–E, instead of applying selected group phase combinations of excitation signals to the transducer inputs as in the case of the FIG. 8B–E subprograms. More specifically, as indicated in FIGS. 13B–13D, in each of the three coarse, medium and fine measurement modes, the same A/D conversion (ADC) subprogram (steps S1240', S1340' and S1440', respectively) is performed. In each measuring mode, controller 110 initially selects a Kth one of the N possible group phase combinations of transducer output signals 410' to be connected to the inputs of amplifier 136', as will be described in more detail herein below, and controls signal excitation generator 120' to produce the transducer input signal 400' combination appropriate for the measurement mode. Referring to the flow chart of FIG. 13E, pursuant to the ADC subprogram controller 110' first causes integrator 144 to be reset to a predetermined "zero" output voltage (step S1710'). Controller 110, then causes the integrator to integrate the demodulated resultant transducer output signal 440' for a predetermined time period $T_0$ (step S1720'). Controller 110' then checks (step S1730') the polarity of the integrator output 450' as sensed by comparator 146' (signal 116'), and a polarity indicator constant P is set to a plus or a minus 1 value according to the sensed polarity (steps S1740' and S1750'). Controller 110' then changes the setting of the transducer output signal combiner switches 132' to select a new Kth group phase combination of transducer output signals 410' to be applied to the respective amplifier 136' inputs according to the value of K+2P (step S1760'), and the demodulated resultant transducer output signal 440' produced by the new group phase combination of output signals connected to the amplifier 136' inputs is then integrated until the output of integrator 144 reaches zero as sensed by comparator 146 (step S1770'). During the second integration, the integration time T is measured by an internal counter in the controller 110', which is incremented by clock signal 123, until the comparator output signal 116 indicates a zero integrator output. If the integrator output during the second integration interval does not reach zero within a predetermined time $T_{max}$, each of the measurement mode subprograms goes into a loop outside the ADC subprogram (step S1250', S1350', S1450'), and changes the group phase combination of transducer output signals 410' used to generate the initial transducer output signal 440' integrated during the initial integration of the ADC subprogram (step S1720'), as will be explained in more detail hereinbelow.

Referring to FIG. 13B, the coarse measurement mode subprogram starts (step S1210) by generating the control signal 112' which sets excitation signal combiner 120' to produce the excitation signals 400-1' and 400-2' appropriate for the coarse measurement mode as described hereinabove. Controller 110' next selects a group phase combination number K from among the coarse/medium combinations shown in FIG. 12 (step S1220'). Preferably, as discussed above in connection with the program of FIG. 8B, following initial start up, the value of K is set equal to the value of $K_c$ calculated during the previous coarse measurement; and in those cases where no previous K-value exists, such as, for example, at start up of the caliper following a power-off mode, an arbitrary value of K can be used as the initial value. The program will keep iterating through the coarse measurement mode until the correct value of K has been reached.

Once the K-value has been selected, switches S1-S8 of signal combiner 130' are set to connect the corresponding group phase combination of transducer output signals 410' to the respective inputs of amplifier 136' (step S1230'), and the ADC subprogram described hereinabove (FIG. 13E) is performed (step S1240'). The value of second integration time T produced by the ADC subprogram is compared with the value of $T_{max}$ set for the coarse measurement mode (20 for the exemplary embodiment described herein) (step S1250'). For values of T larger than 20, the K-number is adjusted one step up or down dependent on the P value generated by the ADC subprogram (step S1260'). Thereafter the measurement loop (steps S1230'-S1260') is repeated again with the corresponding new K-number used to select the initial group phase combination of output signals 410' connected to the amplifier 136 inputs, and thus the initial resultant transducer output signal 430' is produced. This process continues until a value of time T not greater than 20 is obtained from the ADC subprogram.

Next (step 1270'), a value $K_c$ is updated with the value of K for which the measurement time T was within the predetermined limit. The $K_c$ value will be used as the initial K value for the next coarse measurement, and is also used to obtain a value $M_c$ for the present coarse scale postion. For the exemplary embodiment described herein:

$$M_c = 40\ K_c + PT.$$

Similarly to the coarse mode subprogram of FIG. 8B, controller 110' performs a "wrap-around" calculation when $M_c$ is outside the proper range of values.

Referring to FIG. 13C, the medium measurement mode subprogram is substantially similar to the coarse mode subprogram. Controller 110' starts (step S1310') by generating a control signal 112' which sets the excitation signal generator 120' to produce the excitation signals 400-3' and 400-4' which are appropriate for medium measurements. Next (step S1320'), the controller calculates the K-number of the group phase combination of output signals 410' to be applied to the inputs of amplifier 136' from the among the coarse/medium combinations shown in FIG. 12. Unlike the coarse mode subprogram, the medium mode subprogram uses the coarse scale position value $M_c$ obtained from the coarse mode computation according to the formula $K = M_c - N(Int(M_c/N))$, where $Int(M_c/N)$ is the integer value of the ratio $M_c/N$.

Controller 110' then causes signal combiner switches S11-S18 to connect the Kth group phase combination of output signals 410' to the amplifier 136' inputs and the ADC subprogram to be performed using the resultant signal 440' (steps S1330' and S1340'). Similarly to the coarse mode subprogram, if the value of the second integration time T exceeds 20, the value of $M_c$ used to calculate K is adjusted one step up or down dependent on the P value produced by the ADC subprogram (step S1360'). Thereafter the measuring loop (steps S1320'-S1360') is repeated again with the corresponding new K-number. This process continues until a value of second integration time T within the predetermined limit is obtained from the ADC subprogram. The value of $K_m$ is updated (step S1370') and the medium scale position value $M_m$ is calculated (steps S1380') using (for the exemplary embodiment) the formula:

$$K_m = 40\ K_m + PT.$$

The medium measurement mode also utilizes a wrap-around computation similar to that employed in the coarse measurement mode to derive the value of $M_m$.

Referring to FIG. 13D, the fine measurement mode subprogram is generally similar to the medium mode subprogram. Controller 110' starts (step 1410') by setting the excitation signal generator 120' to produce the excitation signals 400-1' to 400-4' which are appropriate for fine measurements. Controller 110' next calculates (step S1420') a K number for the initial group phase combination of transducer output signals 410' to be applied to the inputs of amplifier 136' using the previously calculated medium scale position value Mm according to the following formula:

$$K = M_m - N(Int(M_m/N))$$

After causing the Kth group phase combination of output signals 410' to be connected to the amplifier 136' inputs, (step S1430'), the ADC subprogram is performed as before (step S1440'). Similarly to the coarse/medium measurement modes, if the calculated value of T exceeds limit $T_{max}$, the $M_m$ number used to calculate K is incremented by one step up or down dependent on the P value produced by the ADC subprogram (steps S1450' and S1460'). If this adjustment causes the $M_m$ value to pass outside its proper range (e.g., the 319/O value) in an up or down direction (step S1462'), the $M_c$ value is also incremented up or down by one increment accordingly. Thereafter, the measurement routine (steps S1420'-S1464') is repeated again with the new K number, and the process continues until a value of time T within the limit $T_{max}$ is obtained from the ADC subprogram. Next the value of $K_f$ is updated with the last calculated value of K (Step S1470') and the fine scale position value $M_f$ is then calculated (step S1480') using (for the exemplary embodiment) the formula:

$$M_f = 64 K_f + PT$$

Similarly to the other two measuring modes, controller 110' performs a wrap-around computation if the calculated value of $M_f$ exceeds its proper range.

It will be appreciated that the foregoing preferred embodiments are merely illustrative of the present invention, and that numerous modifications can be made therein consistently with the spirit and scope of the present invention. In particular, it will be appreciated that the preferred embodiments described herein are adapted for making combined coarse, medium and fine resolution measurements to obtain an accurate absolute position measurement. A central feature of coarse resolution measurements in accordance with the present invention is the provision of an offset receiver-transmitter electrode arrangement on the first support member 20 wherein the receiver and transmitter electrodes are connected in pairs in an offset relationship which is a predetermined function of the position of the transmitter/receiver electrodes with respect to a reference position; and the provision of a further electrode array configured to sense the offset function D(x)/generate an electric field from which the offset can be sensed. This aspect of the present invention is not dependent on the particular distribution of the transmitter and receiver electrodes, nor the manner of signal processing employed to sense the capacitance functions.

Although preferable, it is not necessary for coarse measurements that the first transmitter/second receiver electrodes 310 have a uniform distribution such that the wavelength $W_{t1}$ of the groups of N electrodes 310 is the same for all of the groups, so long as there is a correspondence between the distribution of the electrodes 310 and the configuration of the second receiver/first transmitter electrodes 320A, 320B adjusted for the rate of offset between the electrodes 210A, 210B and the electrodes 320A, 320B. Further, N, the number of electrodes 310 in a group, can have a value as small as 2.

In addition, the distribution of the first receiver/second transmitter electrodes 210 is not of primary importance to coarse measurements in accordance with the present invention. The spacing between electrodes 210 can even be completely random. It is also possible to obtain coarse measurements with less than one electrode 210 per wavelength $W_{t1}$ by superimposing groups of electrodes 310 and sensing the transfer functions for the resulting plurality of transfer channels between the electrodes 310 via the electrodes 210 and the electrodes 220 to the electrodes 320. If the number of such channels is at least three, and the width of the electrodes 210 is not an integral of the wavelength $W_{t1}$, it is possible to measure the function D(x), and thereby obtain a coarse position measurement. (A transmission channel is defined, e.g., for the embodiments of FIGS. 1A and 4A, from an excitation signal connection to any one of the N first transmitter electrodes in a first transmitter electrode group via the first receiver electrode and the second transmitter electrodes to one of the second receiver electrode connections. As described hereinabove, the one second receiver electrode connection can also be 2 connections of opposite polarity. More defined transmission channels can also be obtained by adding together several such connections, as is done in the preferred embodiments described hereinabove.)

Each transmission channel has a transfer function that varies with the displacement between the first and second support members (i.e., is a function of x). The amplitude of the transfer functions is preferably, but not necessarily, equal for all of the transmission channels; and is phased-shifted (in the x direction) between channels. The shape of these transfer functions can be, for example, sinusoidal, triangular or some other predetermined shape. A sinusoidally shaped transfer function is preferred because of the lesser dependence of the transfer function shape on the gap between the first and second support members. Two transmission channels that are phased-shifted one quarter wavelength in the x direction provides, in principle, enough information for determining the position anywhere within the period length of the function. It is thus possible to make a functioning device according to the present invention with N equal to two.

By making the electrode arrays 310 and 320 have a regular, periodic structure, it becomes simpler to design and to predict the performance of the measuring system. Still further, it is possible to sense the offset function D(x) without directly sensing the voltage distribution of the electric field pattern produced by the electrodes 220 in response to excitation of at least one group of electrodes 310 or electrodes 320. An example of another way of sensing the offset function is to rely on at least two transfer functions for signals between the first transmitter array 310 and the array 320 via the electrodes 210 and the electrodes 220. If the shape and relation between the transfer functions with respect to the measurement direction is known, the measurement position can be derived from measurements of the transfer functions.

The ability of a measuring transducer in accordance with the present invention to provide both fine and coarse/medium resolution measurements using the same set of electrodes results from the lack of restrictions on the configuration of the electrode array 210 for coarse resolution measurements. The electrode array 210 can thus be given a periodicity and electrode shape that meets the requirements for fine resolution measurements. An electrode array 210 is thus given a pitch $P_{r1}$ and electrode shape which, in combination with the electrode pitch and shape of the electrodes 310, provides a periodic transfer function with a wavelength $W_f$ for signals transmitted between the electrodes 310 and 210. A pitch $P_{r1}$ equal to the fine wavelength $W_f$ and an electrode which is smaller than $W_f$ (and preferably not larger than $W_f/2$) provides the desired periodicity of the transfer function to one electrode 310 of a width which is preferably not greater than $W_f/2$. Several electrodes 310 positioned at intervals which are integral multiples of wavelength $W_f$ can be connected together to provide a stronger transducer output signal. It is also possible to obtain the same transfer function with electrodes 210 positioned at intervals which are integral multiples of wavelength $W_f$ combined with electrodes 310 which are positioned at a regular pitch equal to wavelength $W_f$. There may even be some combination of irregular distributions of electrodes 310 and 210 that results in the desired transfer function.

What is claimed is:

1. Capacitive-type measuring apparatus comprising:
   first and second support members, said support members being relatively displaceable with respect to each other, and at least one of said support members being displaceable relative to a measurement axis;
   an array of first electrodes disposed on said first support member in alignment with said measurement axis;
   an array of second electrodes disposed on said second support member in alignment with said measurement axis and such that differing portions of said second electrode array are capacitively coupled with said first electrode array in dependence on the relative positions of said supporting members; and
   an array of third electrodes disposed on said second support member in relative alignment with said second electrode array, each of said third electrodes being electrically connected to a corresponding one of said second electrodes so as to be offset from the corresponding second electrode by an amount which is a predetermined function of the position of the third electrode relative to a reference position on said measurement axis.

2. The measuring apparatus of claim 1 further comprising:
   fourth electrode means disposed on said first support element in relative alignment with said first electrode array for sensing said electrode offset or producing an electric field from which said electrode offset can be sensed.

3. The measuring apparatus of claim 2 wherein said second electrodes are spaced from each other relative to the measurement axis by a pitch $P_{r1}$ defining a scale wavelength $W_f$, and at least one group of first electrodes is defined by N adjacent electrodes, where N is an integer greater than two in value; said at least one first electrode group defining a wavelength $W_t$, and the first electrodes in each group are positioned within the group so as to respectively occupy predetermined group positions which span a distance greater than one wavelength $W_f$, and such that each group position corresponds to the relative position of a different one of a group of relative fine wavelength segment positions obtained by dividing the wavelength $W_t$ into intervals corresponding to the fine wavelength, and dividing each interval into N equal segments.

4. The measuring apparatus of claim 3 further comprising:
   excitation signal means for applying periodically varying excitation signals to said fourth electrode means; and
   signal combining means for selectively combining different sets of output signals, produced by the electrodes in each first electrode group in response to said excitation signals, into first and second composite signals, said output signals being combinable in a first order according to the sequence of physical positions occupied by the first electrodes relative to each other in each first electrode group, and in a second order according to the sequence of relative fine wavelength segment positions in which the respective first electrode group positions are arranged.

5. The measuring apparatus of claim 4 wherein said first and second orders of combination constitute different numerical orders.

6. The measuring apparatus of claim 5 wherein said signal combining means further comprises means for differentially combining said first and second composite signals to produce a combined output signal.

7. The measuring apparatus of claim 6 wherein N is an integer multiple of four, and said signal combining means produces N combinations of first and second composite signals, the first electrode output signals in the first and second composite signals in each of said combinations corresponding to relative spatial phase positions which successively incrementally change from one combination to the next; and wherein said measuring apparatus further comprises:
   means for demodulating said combined output signal to produce a corresponding demodulated signal;
   means for selecting a first one of said combinations of first and second composite signals to produce a first combined output signal;
   means for performing a dual ramp integration wherein the first demodulated signal corresponding to said first combined signal is integrated for a predetermined time interval by integrator means, a second one of said combinations of first and second composite signals is selected to produce a second combined output signal such that the corresponding second demodulated signal causes integration of the integrator means output in the reverse direction from said integration of said first demodulated signal, and the second demodulated signal is integrated by said integrator means until the integrator output returns to a reference level;
   means for measuring the integration time of said second demodulated signal integration and for producing a control output when the integration time exceeds a predetermined limit value;
   means responsive to said control output for resetting said dual ramp integration means, for repetitively selectively applying a different pair of first and second ones of said combinations of first and second composite signals to successively produce new first and second combined output signals, and for causing said integration means to integrate the resultant first and second demodulated signals until there is no control output from said integration time measuring means.

8. The measuring apparatus of claim 7 wherein the amplitudes of said first electrode output signals are substantially a sinusoidal function of the displacement between said first and second support members, and said predetermined time limit value for said integration time of said second demodulated signals corresponds to the range over which the ratio of said first and second combined output signals is substantially linear.

9. The measuring apparatus of claim 8 wherein said fourth electrode means comprises two fourth electrodes and said measuring apparatus further comprises:
means for selectively applying two excitation signals in the same and in an inverted phase relationship to the respective fourth electrodes.

10. The measuring apparatus of claim 2 wherein said first electrodes are spaced from each other at predetermined intervals relative to the measurement axis, and at least one group of first electrodes is defined by at least two adjacent first electrodes; said fourth electrode means comprises at least one elongated fourth electrode having a shape which varies relative to the measurement axis in correspondence with the measurement axis distance spanned by each first electrode group.

11. The measuring apparatus of claim 10 wherein said first electrodes are spaced at uniform predetermined intervals with a pitch $P_{t1}$, and said at least one first electrode group defines a wavelength $W_{t1}$; and said fourth electrode means comprises an elongate array of discrete fourth electrodes spaced from each other such that the pitch between adjacent pairs of fourth electrodes defines a wavelength $W_{r2}$ having a predetermined relationship to said wavelength $W_{t1}$.

12. The measuring apparatus of claim 10 wherein said first electrodes are spaced at uniform predetermined intervals with a pitch $P_{t1}$, and said at least one first electrode group defines a wavelength $W_{t1}$; and said at least one fourth electrode has a shape which varies periodically over a wavelength $W_{r2}$ having a predetermined relationship to said wavelength $W_{t1}$.

13. The measuring apparatus of claim 12 wherein said at least one fourth electrode spans a length substantially equal to an integral number of wavelengths $W_{t1}$.

14. The measuring apparatus of claim 12 wherein said second electrodes are uniformly spaced from each by a pitch $P_{r1}$ defining a scale wavelength $W_f$.

15. The measuring apparatus of claim 14 wherein said third electrodes are spaced uniformly from each other by a pitch $P_{t2}$ different from pitch $P_{r1}$ such that the variation in said offset of said third electrodes relative to the corresponding second electrodes is a linear function of the position of each third electrode relative to said reference position; and wherein said wavelength $W_{r2} = W_{t1} (P_{t2}/P_{r1})$.

16. The measuring apparatus of claim 12 wherein said fourth electrode shape is substantially sinusoidal.

17. The measuring apparatus of claim 12 wherein said fourth electrode shape is substantially triangular.

18. The measuring apparatus of claim 12 wherein said fourth electrode shape is substantially rectangular.

19. Capacitive-type measuring apparatus comprising:
first and second support members, said support members being relatively displaceable with respect to each other, and at least one of said support members being displaceable relative to a measurement axis;
an array of first electrodes disposed on said first support member in alignment with said measurement axis;
an array of second electrodes disposed on said second support member in alignment with said measurement axis and such that differing portions of said second electrode array are capacitively coupled with said first electrode array in dependence on the relative positions of said supporting members;
an array of third electrodes disposed on said second support member in relative alignment with said second electrode array, at least one group of second electrodes being respectively electrically connected to a corresponding at least one group of third electrodes, each of said third electrodes in said at least one third electrode group being electrically connected to a corresponding one of said second electrodes so as to be offset from the corresponding second electrode by an amount which is a predetermined function of the position of the third electrode relative to the center of said at least one group.

20. Capacitive-type measuring apparatus comprising:
first and second support members, said support members being relatively displaceable with respect to each other, and at least one of said support members being displaceable relative to a measurement axis;
an array of first electrodes disposed on said first support member in alignment with said measurement axis;
at least one array of second electrodes disposed on said second support member in alignment with said measurement axis and such that differing portions of said at least one second electrode array are capacitively coupled with said first electrode array in dependence on the relative positions of said supporting members;
an array of third electrodes disposed on said second support member in relative alignment with said at least one first array of second electrodes, each of said electrodes being electrically connected to a corresponding one of said second electrodes so as to be offset from the corresponding second electrode by an amount which is a predetermined function of the position of the third electrode relative to a reference position on said measurement axis; the spatial range occupied by the third electrodes, over which the degree of electrode offset between the third electrodes and the second electrodes changes by a predetermined amount, defining a first measurement range;
an array of fourth electrodes disposed on said second support member in relative alignment with said at least one array of second electrodes,
at least one group of second electrodes being respectively electrically connected to a corresponding at least one group of fourth electrodes, each of said fourth electrodes in said at least one fourth electrode group being electrically connected to a corresponding one of said second electrodes so as to be offset from the corresponding second electrode by an amount which is a predetermined function of the position of the fourth electrode relative to the center of said at least one fourth electrode group, and such that the degree of electrode offset changes over said fourth electrode group by said predetermined amount, and the spatial range occupied by said at least one fourth electrode group defining a second measurement range smaller than said first measurement range.

21. The measuring apparatus of claim 20 further comprising:

fifth electrode means disposed on said first support member in relative alignment with said first electrode array for sensing said electrode offset or producing an electric field from which said electrode offset can be sensed.

22. The measuring apparatus of claim 20 further comprising:
fifth electrode means disposed on said first support element in relative alignment with said first electrode array for sensing said electrode offset between said third and said second electrode; and
sixth electrode means disposed on said first support element in relative alignment with said first electrode array for sensing said electrode offset between said at least one fourth electrode group and the corresponding second electrodes.

23. The measuring apparatus of claim 22 wherein said first electrodes are spaced at uniform predetermined intervals relative to the measurement axis with a pitch $P_{r1}$, at least one group of first electrodes is defined by at least two adjacent first electrodes, said at least one first electrode group defining a wavelength $W_{t1}$; said second electrodes are uniformily spaced from each other by a pitch $P_{r1}$ defining a scale wavelength $W_f$, said second measuring range is an integral multiple of said scale wavelength $W_f$, and said predetermined amount of electrode offset change is substantially equal to said wavelength $W_{t1}$.

24. The measuring apparatus of claim 23 wherein said fourth electrodes in said at least one fourth electrode group are spaced from each other by a uniform pitch $P_{t3}$ different from pitch $P_{r1}$.

25. The measuring apparatus of claim 24 wherein said pitch $P_{t3}$ is less than said pitch $P_{r1}$.

26. The measuring apparatus of claim 24 wherein said pitch $P_{t3}$ is greater than said pitch $P_{r1}$.

27. The measuring apparatus of claim 20 wherein said second electrodes are spaced from each other relative to the measurement axis by a pitch $P_{r1}$ defining a scale wavelength $W_f$, and at least one group of first electrodes is defined by N adjacent electrodes, where N is an integer greater than two in value; said at least one first electrode group defining a wavelength $W_t$, and the first electrodes in each group are positioned within the group so as to respectively occupy predetermined group positions which span a distance greater than one wavelength $W_f$, and such that each group position corresponds to the relative position of a different one of a group of relative fine wavelength segment positions obtained by dividing the wavelength $W_t$ into intervals corresponding to the fine wavelength, and dividing each interval into N equal segments.

28. Capacitive-type measuring apparatus comprising:
first and second support members, said support members being relatively displaceable with respect to each other, and at least one of said support members being displaceable relative to a measurement axis;
electrode array means disposed on said first and second support members in relative alignment with said measurement axis for providing a plurality of discrete signal transmission paths each having a capacitive transfer function with first and second components, said first component varying according to a predetermined function of the displacement between said support members over a first predetermined wavelength, and said second component varying according to a predetermined function of the displacement between said support members over a second predetermined wavelength shorter than said first predetermined wavelength; and
filtering means for selectively sensing variations caused by one of said first and second transfer function components in output signals produced by said electrode array means in response to excitation signals applied thereto, said filtering means comprising complementary electrode means included in said electrode array means, said complementary electrode means being configured so as to produce electrical fields in response to excitation signals applied in inverted and non-inverted phase relationship to the complementary electrode means which permit the first or the second transfer function component to be derived from output signals produced by said first electrode array.

29. The measuring apparatus of claim 28 wherein said complementary electrode means comprises first and second complementary elongate electrode elements which each has a shape that varies according to a predetermined function relative to the measurement axis.

30. The measuring apparatus of claim 29 wherein said complementary electrode means comprises a plurality of electrode pairs spaced relative to the measurement axis such that the electrodes in each pair occupy complementary phase positions.

* * * * *